United States Patent
Lee et al.

(10) Patent No.: US 10,984,871 B2
(45) Date of Patent: Apr. 20, 2021

(54) NON-VOLATILE MEMORY DEVICE AND METHOD OF ERASING THE SAME

(71) Applicant: SAMSUNG ELECTRONICS CO., LTD., Suwon-si (KR)

(72) Inventors: Jun-Gyu Lee, Hwaseong-si (KR); Sung-Whan Seo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/994,010

(22) Filed: Aug. 14, 2020

(65) Prior Publication Data
US 2020/0381058 A1    Dec. 3, 2020

Related U.S. Application Data

(63) Continuation-in-part of application No. 16/197,886, filed on Nov. 21, 2018, now Pat. No. 10,777,279.

(30) Foreign Application Priority Data

Nov. 22, 2017    (KR) .................. 10-2017-0156615

(51) Int. Cl.
*G11C 11/34*    (2006.01)
*G11C 16/16*    (2006.01)
(Continued)

(52) U.S. Cl.
CPC .......... *G11C 16/16* (2013.01); *G11C 16/0433* (2013.01); *G11C 16/08* (2013.01);
(Continued)

(58) Field of Classification Search
CPC ..... G11C 16/16; G11C 5/146; G11C 16/0483; G11C 16/08; G11C 16/30; G11C 16/32;
(Continued)

(56) References Cited

U.S. PATENT DOCUMENTS 5,521,866 A * 5/1996 Akaogi .............. G11C 16/0416
                                                    257/E27.103
7,813,184 B2    10/2010 Kim et al.
(Continued)

FOREIGN PATENT DOCUMENTS

KR    10-2009-0070607    7/2009

OTHER PUBLICATIONS

Office Action dated Dec. 9, 2019 in Corresponding U.S. Appl. No. 16/197,886.

*Primary Examiner* — Viet Q Nguyen
(74) *Attorney, Agent, or Firm* — F. Chau & Associates, LLC

(57) ABSTRACT

A non-volatile memory device includes a memory cell region including a first metal pad; a peripheral circuit region including a second metal pad and vertically connected to the memory cell region by the first metal pad and the second metal pad; a substrate in the memory cell region; a memory cell array in the memory cell region comprising a plurality of gate conductive layers stacked on the substrate and a plurality of pillars penetrating through the plurality of gate conductive layers and extending in a direction perpendicular to a top surface of the substrate, wherein at least one of the plurality of gate conductive layers is a ground select line; a control logic circuit in the peripheral circuit configured to output an erase enable signal for controlling an erase operation with respect to the memory cell array; a substrate bias circuit in the peripheral circuit configured to, in response to the erase enable signal, output a substrate bias voltage at a first target level to the substrate from a first time to a second time after the first time during a first delay period and, after the first delay period gradually increase a level of the substrate bias voltage to an erase voltage having a higher level than the first target level; and a row decoder in the peripheral circuit configured to apply a ground voltage to the (Continued)

ground select line based on control of the control logic circuit during the first delay period.

20 Claims, 15 Drawing Sheets

(51) Int. Cl.
*G11C 16/32* (2006.01)
*G11C 16/04* (2006.01)
*G11C 16/28* (2006.01)
*G11C 16/08* (2006.01)
*G11C 16/30* (2006.01)

(52) U.S. Cl.
CPC .............. *G11C 16/28* (2013.01); *G11C 16/30* (2013.01); *G11C 16/32* (2013.01)

(58) Field of Classification Search
CPC ........... G11C 11/5671; H01L 27/11556; H01L 27/1157; H01L 27/11582
USPC ..................................................... 365/185.11
See application file for complete search history.

(56) References Cited

U.S. PATENT DOCUMENTS

| | | | |
|---|---|---|---|
| 8,542,535 B2 | 9/2013 | Dutta et al. | |
| 8,553,466 B2* | 10/2013 | Han | H01L 27/1157 365/185.29 |
| 8,570,808 B2 | 10/2013 | Park et al. | |
| 8,670,285 B2 | 3/2014 | Dong et al. | |
| 8,848,456 B2* | 9/2014 | Han | G11C 16/16 365/185.29 |
| 8,923,064 B2* | 12/2014 | Park | G11C 16/04 365/185.19 |
| 8,953,371 B2* | 2/2015 | Shiino | G11C 16/0483 365/185.03 |
| 9,201,440 B2* | 12/2015 | Makiyama | H01L 29/78 |
| 9,286,994 B1 | 3/2016 | Chen et al. | |
| 9,318,209 B1 | 4/2016 | Huynh et al. | |
| 9,478,290 B1* | 10/2016 | Nam | G11C 16/3427 |
| 9,490,020 B2 | 11/2016 | Louie et al. | |
| 9,508,441 B1* | 11/2016 | Nam | G11C 16/0483 |
| 9,659,662 B2* | 5/2017 | Nam | G11C 16/0483 |
| 2001/0046156 A1* | 11/2001 | Miyazaki | G11C 5/143 365/156 |
| 2012/0206961 A1* | 8/2012 | Kito | G11C 16/06 365/185.2 |
| 2019/0156897 A1 | 5/2019 | Lee et al. | |

* cited by examiner

| SSL | Float |
| --- | --- |
| WL | Vwe |
| GSL | VSS → Float |
| SUB | V_TG1 → V_ERS |

US 10,984,871 B2

NON-VOLATILE MEMORY DEVICE AND METHOD OF ERASING THE SAME

CROSS-REFERENCE TO RELATED APPLICATION

This application is a continuation-in-part of U.S. application Ser. No. 16/197,886, filed on Nov. 21, 2018, which claims the benefit of priority under 35 U.S.C. § 119 to Korean Patent Application No. 10-2017-0156615, filed on Nov. 22, 2017, in the Korean Intellectual Property Office, the disclosure of which is incorporated by reference in its entirety herein.

BACKGROUND

1. Technical Field

The inventive concept relates to a memory device, and more particularly, to a non-volatile memory device and a method of erasing the same.

2. Discussion of Related Art

In recent years, as information communication devices have become multi-functional, there has been a demand for memory devices having a large capacity and high integration. As sizes of memory cells are reduced for high integration, operation circuits and wiring structures included in memory devices are becoming complicated. Therefore, there is a demand for a memory device having improved electrical characteristics and improved reliability while improving the integration of the memory device.

SUMMARY

At least one embodiment of the inventive concept provides a non-volatile memory device having a vertical structure and a method of erasing the same.

According to an exemplary embodiment of the inventive concept, there is provided a non-volatile memory device including a memory cell region including a first metal pad; a peripheral circuit region including a second metal pad and vertically connected to the memory cell region by the first metal pad and the second metal pad; a substrate provided in the memory cell region; a memory cell array provided in the memory cell region including a plurality of gate conductive layers stacked on the substrate and a plurality of pillars penetrating through the plurality of gate conductive layers and extending in a direction perpendicular to a top surface of the substrate, wherein at least one of the plurality of gate conductive layers is a ground select line; a control logic circuit provided in the peripheral circuit configured to output an erase enable signal for controlling an erase operation on the memory cell array; a substrate bias circuit provided in the peripheral circuit configured to, in response to the erase enable signal, output a substrate bias voltage at a first target level to the substrate from a first time to a second time after the first time during a first delay period, after the first delay period, a level of the substrate bias voltage gradually increasing to an erase voltage having being higher level than the first target level; and a row decoder provided in the peripheral circuit and being configured to apply a ground voltage to the ground select line based on control of the control logic circuit during the first delay period.

According to an exemplary embodiment of the inventive concept, there is provided a method of erasing a non-volatile memory device including a memory cell region including a first metal pad, a peripheral circuit region including a second metal pad and vertically connected to the memory cell region by the first metal pad and the second metal pad, a substrate in the memory cell region and a plurality of memory blocks in the memory cell region including a plurality of cell strings disposed on the substrate and a plurality of cell transistors stacked in a direction perpendicular to the substrate, each cell string including one or more ground select transistors, the method including: applying, by a control circuit of the non-volatile memory in the peripheral circuit, a ground voltage to a ground select line connected to the ground select transistor and a substrate bias voltage at a first target level to the substrate from a first time to a second time after the first time during a first delay period; and gradually increasing, by the control circuit, a level of the substrate bias voltage to an erase voltage having a higher level than the first target, after the first delay period.

According to an exemplary embodiment of the inventive concept, there is provided a method of erasing a non-volatile memory device including a first memory cell region including a first metal pad, a peripheral circuit region including a second metal pad, a substrate in the first memory cell region, a first memory cell array in the first memory cell region including a first common source line, and first cell strings, wherein the first cell strings include at least one first ground select line, a control logic circuit in the peripheral circuit configured to output an erase enable signal for controlling an erase operation with respect to the first memory cell array and a voltage generating circuit in the peripheral circuit configured to, based on the erase enable signal for the first memory cell array, output a first common source line voltage at a first target level to the first common source line from a first time to a second time after the first time during a first delay period, after the first delay period, a level of the first common source line voltage gradually increasing to an first erase voltage having a higher level than the first target level, and output a first ground select line voltage at a level lower than the first erase voltage by a predetermined voltage to the first ground select line.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EXEMPLARY EMBODIMENTS

Figure 1:
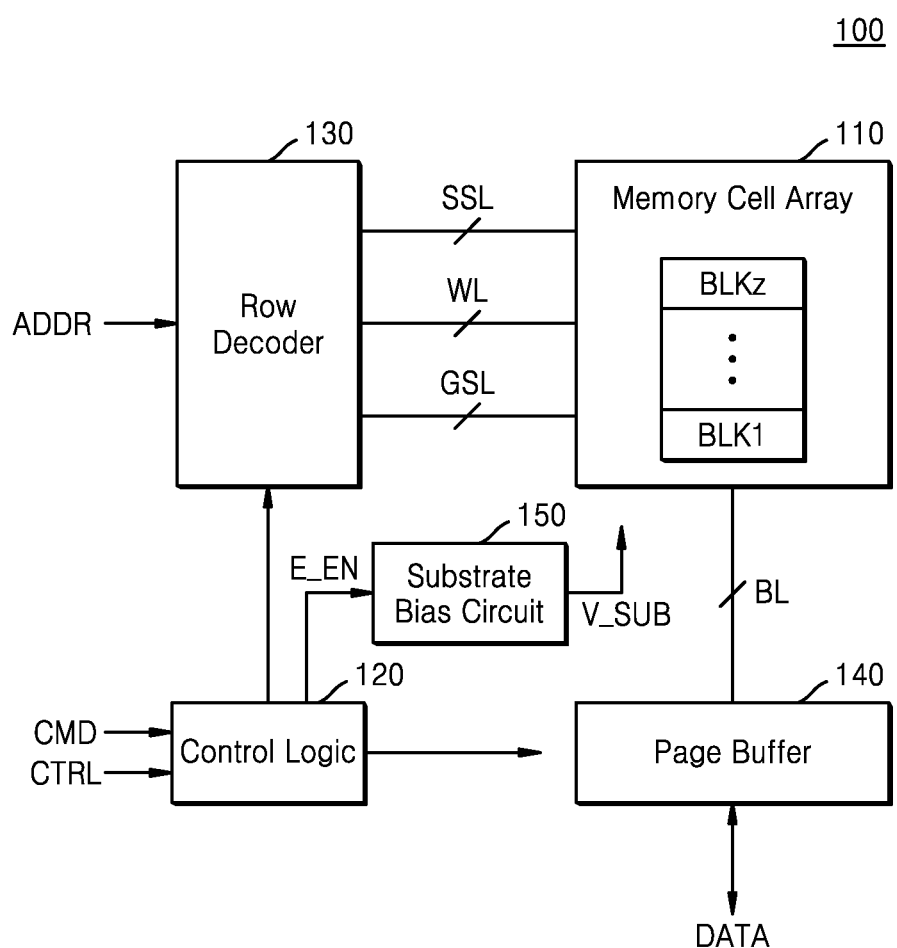
FIG. 1 is a block diagram showing a memory device according to an exemplary embodiment of the inventive concept.

FIG. 1 is a block diagram showing a memory device according to an exemplary embodiment of the inventive concept.

Referring to FIG. 1, a memory device 100 includes a memory cell array 110, a control logic circuit 120, a row decoder 130, a page buffer 140, and a substrate bias circuit 150. Although not shown, the memory device 100 may further include a data input/output circuit or an input/output interface. Although not shown, the memory device 100 may further include various sub-circuits including a voltage generating circuit for generating various voltages needed for operating the memory device 100 and an error correction circuit for correcting errors of data read from the memory cell array 110.

The memory cell array 110 may include a plurality of memory cells. In an embodiment, the memory cell array is connected to string select lines SSL, word lines WL, ground select lines GSL, and bit lines BL. In an embodiment, the memory cell array 110 is connected to the row decoder 130 through the string select lines SSL, the word lines WL, and the ground select lines GSL and is connected to the page buffer 140 via the bit lines BL. The page buffer 140 may be used to temporarily store data before it is written to the memory cell array 110 or to temporarily store data read from the memory cell array before it is output to an external device.

For example, the plurality of memory cells included in the memory cell array 110 may be non-volatile memory cells that retain stored data even when power supplied thereto is interrupted. In detail, when the plurality of memory cells are non-volatile memory cells, the memory device 100 may be electrically erasable programmable read-only memory (EEPROM), a flash memory, phase change random access memory (PRAM), resistance random access memory (RRAM), a nano floating gate memory (NFGM), polymer random access memory (PoRAM), magnetic random access memory (MRAM), or ferroelectric random access memory (FRAM). Exemplary embodiments of the inventive concept will be described below assuming the plurality of memory cells are NAND flash memory cells, but the inventive concept is not limited thereto.

The memory cell array 110 includes a plurality of memory blocks BLK1 through BLKz, and each memory block may have a planar structure or a 3-dimensional structure. The memory cell array 110 may include at least one of a single-level cell block including single-level cells (SLC), a multi-level cell block including multi-level cells (MLC), a triple-level cell block including triple-level cells (TLC), and a quad-level cell block including quad-level cells (QLC). For example, some memory blocks of the plurality of memory blocks BLK1 through BLKz may be single-level cell blocks, whereas the other memory blocks may be multi-level cell blocks, triple-level cell blocks, or quad-level cell blocks.

The control logic circuit 120 receives a command CMD and a control signal CTRL from an external device outside the memory device 100. The control logic circuit 120 may control the overall operation of the memory device 100. The control logic circuit 120 may control the memory device 100 to perform a memory operation corresponding to the command CMD provided from, for example, a memory controller (not shown). For example, the command CMD may be a read command, a write command, or a delete command. The control logic circuit 120 may generate various internal control signals used in the memory device 100 in response to the control signal CTRL provided from the memory controller (not shown). For example, the control logic circuit 120 may adjust levels of voltages provided to the word lines WL, the bit lines BL, and the ground select lines GSL when performing a memory operation such as a program operation or an erase operation.

In an exemplary embodiment, when an erase operation is performed, the control logic circuit 120 outputs an erase enable signal E_EN to the substrate bias circuit 150 for controlling the erase operation. In an embodiment, the control logic circuit 120 activates the erase enable signal E_EN after determining that the command CMD is an erase command. The control logic circuit 120 outputs the erase enable signal E_EN to control the substrate bias circuit 150 to output a substrate bias voltage V_SUB to a substrate supporting the memory cell array 110. For example, the memory cell array 110 is disposed on the substrate. According to an exemplary embodiment, the control logic circuit 120 controls the substrate bias circuit 150 to generate a first target voltage during a first delay time as the substrate bias voltage V_SUB and, after the first delay time, generates a substrate bias voltages V_SUB with gradually increased voltage levels until the voltage level of the substrate bias voltage V_SUB reaches that of an erase voltage, wherein the voltage level of the erase voltage is higher than that of the first target voltage. In an embodiment, the erase voltage is used to perform the erase operation.

The row decoder 130 receives an address ADDR. For example, the row decoder 130 receives the address ADDR from a device outside the memory device 100. The row decoder 130 may select at least one of the plurality of memory blocks BLK1 through BLKz in response to the address ADDR provided from a memory controller (not shown), for example. The row decoder 130 may select at least one of the word lines of a memory block selected in response to the address ADDR.

The row decoder 130 may transfer voltages for performing a memory operation to word lines WL of a selected memory block (e.g., BLK1). For example, during a program operation, the row decoder 130 may transfer a program voltage and a verify voltage to a selected word line and transfer a pass voltage to an unselected word line. For example, a selected word line may correspond to a first part of the memory cell array 110 to be written with data and an unselected word line may correspond to a second part of the memory cell array 110 that is not to be written with the data while the first part is being written. Furthermore, the row decoder 130 may select some of the string select lines SSL in response to the address ADDR.

In an embodiment, the row decoder 130 floats the ground select lines GSL based on a control of the control logic circuit 120 when an erase operation is performed. According to an exemplary embodiment, when an erase operation is performed, the row decoder 130 floats the ground select lines GSL after the first delay time in which the first target voltage is generated as the substrate bias voltage V_SUB.

The page buffer 140 may receive data DATA from a device outside the memory device 100 and transmit the received data DATA to the memory cell array 110. The page buffer 140 is connected to the memory cell array 110 via the bit lines BL. The page buffer 140 may operate as a write driver or a sense amplifier. In an embodiment, during a program operation, the page buffer 140 operates as a write driver and applies voltages according to the data DATA to be stored in the memory cell array 110 to the bit lines BL. In addition, during a read operation, the page buffer 140 may operate as a sense amplifier and sense the data DATA stored in the memory cell array 110.

In an exemplary embodiment, the substrate bias circuit 150 outputs the substrate bias voltage V_SUB based on the erase enable signal E_EN output from the control logic circuit 120. According to an exemplary embodiment, in response to the erase enable signal E_EN, the substrate bias circuit 150 generates the first target voltage as the substrate bias voltage V_SUB for output to the substrate supporting the memory cell array 110 during the first delay time. Furthermore, after the first delay time, the substrate bias voltages V_SUB with gradually increased voltage levels are generated until the voltage level of the substrate bias voltage V_SUB reaches that of an erase voltage, wherein the voltage level of the erase voltage is higher than that of the first target voltage.

Figure 2:
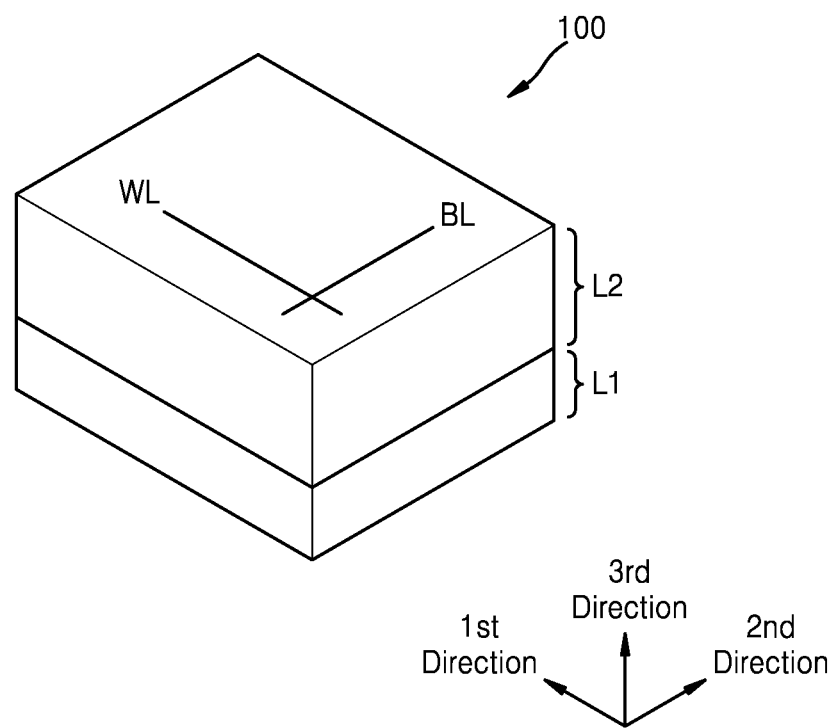
FIG. 2 is a schematic diagram showing the structure of a memory device according to an exemplary embodiment of the inventive concept.

FIG. 2 is a schematic diagram showing the structure of a memory device according to an exemplary embodiment of the inventive concept. FIG. 2 shows an example of the structure of the memory device 100 of FIG. 1. Hereinafter, FIG. 2 will be described with reference to FIG. 1.

Referring to FIG. 2, the memory device 100 includes a first semiconductor layer L1 and a second semiconductor layer L2. The second semiconductor layer L2 may be deposited on the first semiconductor layer L1 in a third direction. According to an exemplary embodiment, the memory cell array 110 is formed in the second semiconductor layer L2, and at least one of the control logic circuit 120, the row decoder 130, the page buffer 140, and the substrate bias circuit 150 is arranged in the first semiconductor layer L1. For example, the first semiconductor layer L1 may include a lower substrate and, by arranging semiconductor elements like transistors and patterns for wiring the semiconductor elements on the lower substrate, various circuits may be disposed in the first semiconductor layer L1.

After circuits are disposed in the first semiconductor layer L1, the second semiconductor layer L2 including the memory cell array 110 may be disposed. For example, the second semiconductor layer L2 may include a substrate, and, by arranging a plurality of gate conductive layers stacked on the substrate and a plurality of pillars, which penetrate through the plurality of gate conductive layers and extend in a direction perpendicular to the top surface of an upper substrate (e.g., a third direction), the memory cell array 110 may be disposed on the second semiconductor layer L2. Furthermore, in the second semiconductor layer L2, patterns for electrically interconnecting the memory cell array 110 (that is, the word lines WL and the bit lines BL) and the circuits disposed in the first semiconductor layer L1 may be arranged. For example, the word lines WL may extend in a first direction and be arranged in a second direction. Furthermore, the bit lines BL may extend in the second direction and be arranged in the first direction.

Therefore, the memory device 100 may have a structure in which peripheral circuits like the control logic circuit 120, the row decoder 130, the page buffer 140, and the substrate bias circuit 150 and the memory cell array 110 are arranged in a stacking direction (e.g., the third direction), that is, a Cell-On-Peri or Cell-Over-Peri (COP) structure. By disposing circuits other than the memory cell array 110 below the memory cell array 110, the COP structure may effectively reduce occupied areas on the plane perpendicular to the stacking direction, and thus the number of memory cells integrated in the memory device 100 may be increased.

Although not shown in FIG. 2, a plurality of pads may be arranged on the memory device 100 for electrical connection with a device outside the memory device 100. For example, a plurality of pads for commands CMD, addresses ADDR, and control signals CTRL received from a device outside the memory device 100 may be arranged and a plurality of pads for inputting and outputting data DATA may be arranged. The plurality of pads may be arranged adjacent to peripheral circuits, which process signals received from a device outside the memory device 100 or signals transmitted to a device outside the memory device 100, in a vertical direction (the third direction) or a horizontal direction (the first direction or the second direction).

Figure 3:
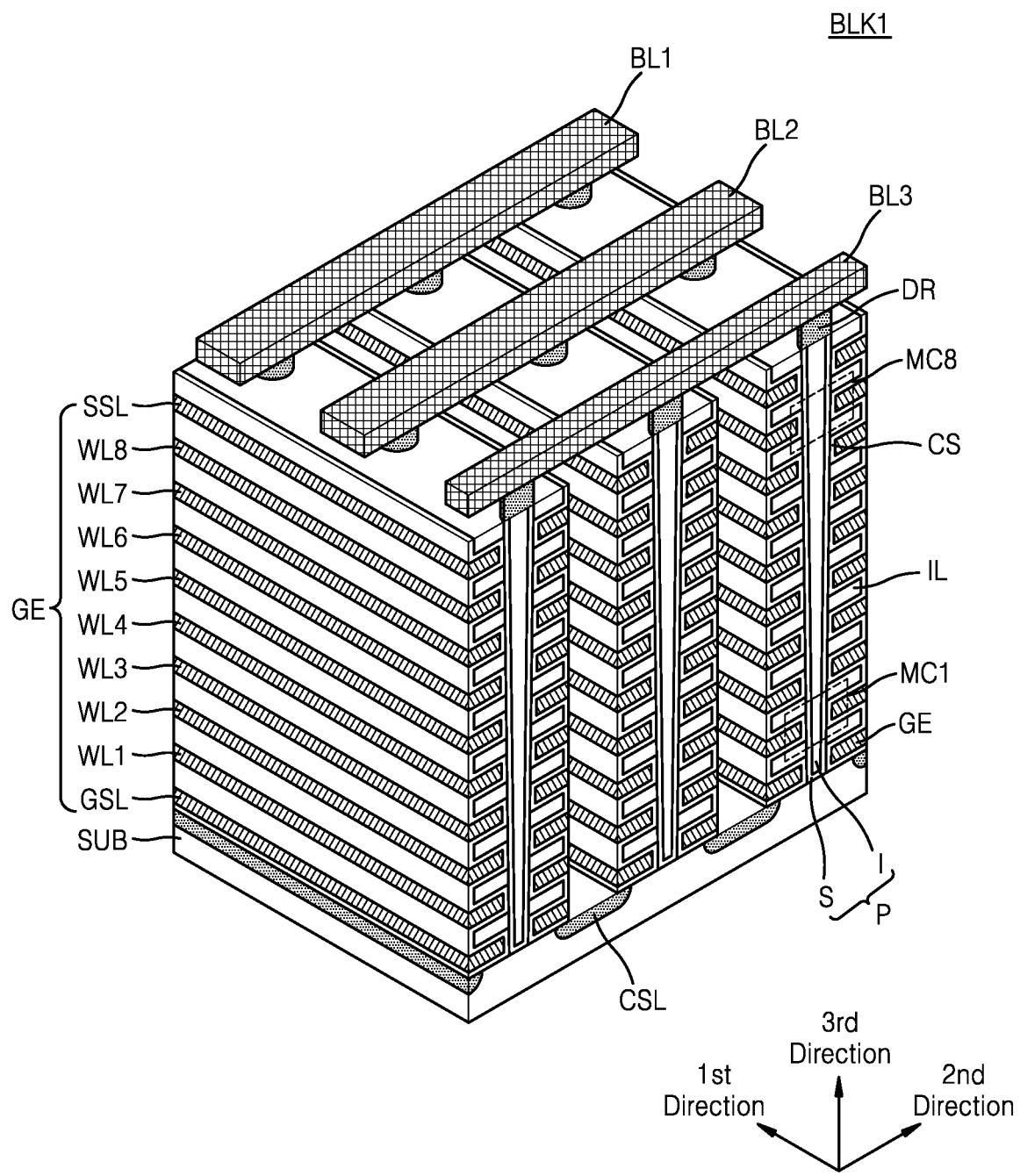
FIG. 3 is a perspective view diagram showing an embodiment of a first memory block from among the memory blocks of FIG. 1.

FIG. 3 is a perspective view diagram showing an embodiment of a first memory block from among the memory blocks of FIG. 1.

Referring to FIG. 3, a first memory block BLK1 may be disposed in a direction perpendicular to a substrate SUB. Although FIG. 3 shows that the first memory block BLK1 includes two select lines GSL and SSL, eight word lines WL1 through WL8, and three bit lines BL1 through BL3, the first memory block BLK1 may include more or less of these lines. Furthermore, in another example, the first memory block BLK1 includes one or more dummy word lines between a first word line WL1 and the ground select line GSL.

The substrate SUB may be a poly-silicon film doped with a first conductivity type, e.g., p-type. The substrate SUB may be a bulk silicon substrate, a silicon-on-insulator (SOI) substrate, a germanium substrate, a germanium-on-insulator (GOI) substrate, a silicon germanium substrate, or an epitaxial thin-film substrate obtained by performing selective epitaxial growth (SEG). The substrate SUB may include a semiconductor material and, for example, may include at least one of silicon (Si), germanium (Ge), silicon germanium (SiGe), gallium arsenide (GaAs), indium gallium arsenide (InGaAs), aluminum gallium arsenide (AlGaAs), or a mixture thereof.

In an embodiment, the substrate SUB is provided with a common source line CSL. For example, the common source line CSL is disposed on the substrate SUB to extend in the first direction. In an embodiment, the common source line CSL is doped with impurities of the second conductivity type (e.g., n-type). A plurality of first insulation films IL extending in the first direction are sequentially provided in the third direction on a region of the substrate SUB between two adjacent common source lines CSL. The plurality of first insulation films IL may be spaced a certain distance from one another in the third direction. There may be additional pluralities of insulation films IL disposed on the substrate SUB between other adjacent common source lines CSL. For example, the plurality of insulation films IL may include an insulation material such as silicon oxide.

A plurality of pillars P, which are arranged sequentially in the first direction and penetrate through the plurality of insulation films IL, may be provided on a region of the substrate SUB between two adjacent common source lines CSL. For example, the plurality of pillars P may penetrate through the plurality of insulation films IL and contact the substrate SUB. In an embodiment, a surface layer S of each pillar P includes a silicon material doped with the first conductivity type and functions as a channel region. In an exemplary embodiment, an internal layer I of each pillar P includes an insulation material such as silicon oxide or an air gap.

In the region between two adjacent common source lines CSL, a charge storage layer CS may be provided along the plurality of insulation films IL, the plurality of pillars P, and an exposed surface of the substrate SUB. The charge storage layer CS may include a gate insulation layer (may also be referred to as a 'tunnelling layer'), a charge trapping layer, and a blocking insulation layer. For example, the charge storage layer CS may have an oxide-nitride-oxide (ONO) structure. Furthermore, on an exposed surface of the charge storage layer CS in the region between two adjacent common source lines CSL, gate electrodes GE like the select lines GSL and SSL and the word lines WL1 through WL8 may be provided.

Drains or drain contacts DR may be provided on the plurality of pillars P, respectively. For example, the drains or drain contacts DR may include silicon material doped with impurities of the second conductivity type. On drain contacts DR, the bit lines BL1 through BL3 extending in the second direction and spaced a certain distance apart from one another in the first direction may be provided.

Figure 4:
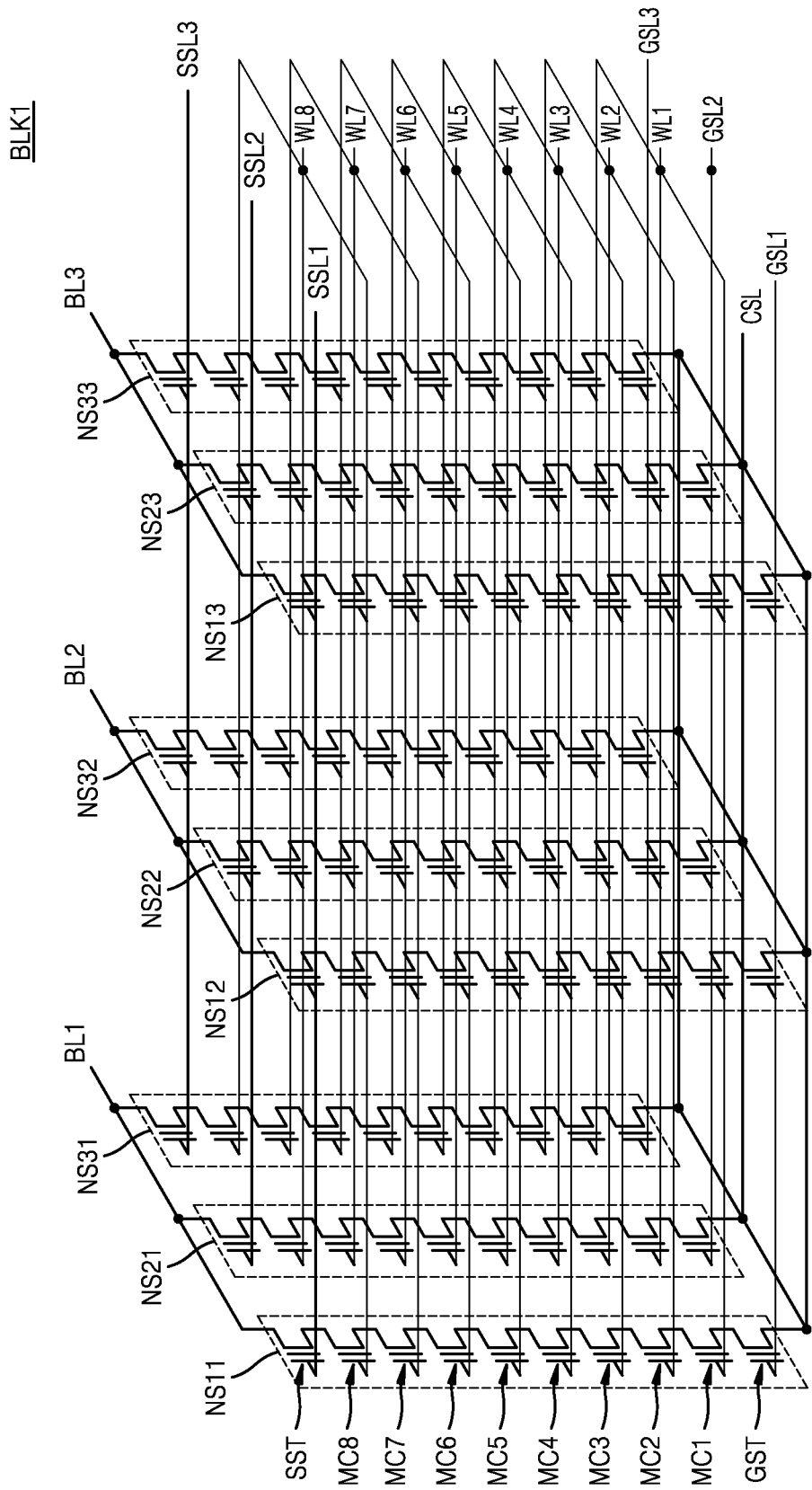
FIG. 4 is a circuit diagram showing an equivalent circuit of a first memory block from among the memory blocks of FIG. 1.

FIG. 4 is a circuit diagram showing an equivalent circuit of a first memory block from among the memory blocks of FIG. 1.

Referring to FIG. 4, the first memory block BLK1 may be a vertical NAND flash memory, and each of the plurality of memory block BLK1 through BLKz shown in FIG. 1 may be implemented as shown in FIG. 4. In an exemplary embodiment, the first memory block BLK1 includes a plurality of NAND cell strings NS11 through NS33, the plurality of word lines WL1 through WL8, the plurality of bit lines BL1 through BL3, a plurality of ground select lines GSL1 through GSL3, a plurality of string select lines SSL1 through SSL3, and the common source line CSL. Here, the number of NAND cell strings, the number of word lines, the number of bit lines, the number of ground select lines, and the number of string select lines may vary according to embodiments. For example, the number of ground select lines may be different from the number of string select lines.

NAND cell strings NS11, NS21, and NS31 are provided between a first bit line BL1 and the common source line CSL, NAND string cells NS12, NS22, and NS32 are provided between a second bit line BL2 and the common source line CSL, and NAND cell strings NS13, NS23, and NS33 are provided between a third bit line BL3 and the common source line CSL. Each NAND cell string (e.g., NS11) may include a string select transistor SST, a plurality of memory cells MC1 through MC8, and a ground select transistor GST that are connected in series.

NAND cell strings connected to one bit line in common may constitute one column. For example, NAND cell strings NS12, NS21, and NS31 connected to the first bit line BL1 in common may correspond to a first column, NAND cell strings NS12, NS22, and NS32 connected to the second bit line BL2 in common may correspond to a second column, and NAND cell strings NS13, NS23, and NS33 connected to the third bit line BL3 in common may correspond to a third column.

NAND cell strings connected to one string select line in common may constitute one row. For example, NAND cell strings NS11, NS12, and NS13 connected to a first string select line SSL1 in common may correspond to a first row, NAND cell strings NS21, NS22, and NS23 connected to a second string select line SSL2 in common may correspond to a second row, and NAND cell strings NS31, NS32, and NS33 connected to a third string select line SSL3 in common may correspond to a third row.

The string select transistor SST may be connected to a corresponding string select line SSL1, SSL2, or SSL3. The plurality of memory cells MC1 through MC8 may be connected to corresponding word lines WL1 through WL8, respectively. The ground select transistor GST may be connected to a corresponding ground select line GSL1, GSL2, or GSL3, and the string select transistor SST may be connected to a corresponding bit line BL1, BL2, or BL3. The ground select transistor GST may be connected to the common source line CSL.

According to a present exemplary embodiment of the inventive concept, word lines at a same height (e.g., WL1) are commonly connected, the string select lines SSL1 through SSL3 are separated from one another, and the ground select lines GSL1 through GSL3 are also separated from one another. For example, in the case of programming memory cells that are connected to the first word lines WL1 and included in the NAND cell string NS11, NS12, and NS13 corresponding to the first column, the first word lines WL1 and the first select lines SSL1 are selected. However, the inventive concept is not limited thereto. According to another exemplary embodiment, the ground select lines GSL1 through GSL3 are commonly connected.

Figures 5, 6:
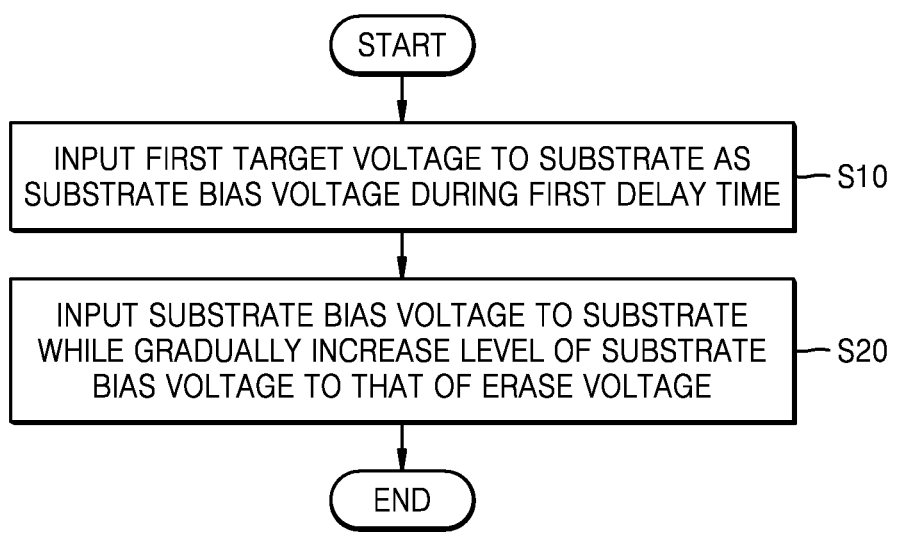
FIG. 5 is a table showing an example embodiment of voltage conditions during an erase operation of the memory device of FIG. 1.
FIG. 6 is a flowchart showing an erase operation of a memory device according to an exemplary embodiment of the inventive concept.

FIG. 5 is a table showing an example embodiment of voltage conditions during an erase operation of the memory device 100 of FIG. 1. For example, an erase operation may be performed by memory blocks. Referring to the memory block BLK1 described above with reference to FIG. 3, an erase operation will be described.

In an exemplary embodiment, in an erase operation, string select lines SSL are floated, and a word line erase voltage Vwe is applied to the word lines WL1 through WL8. In the embodiment, a ground voltage VSS is applied to the ground select lines GSL during the first delay time. In an embodiment, after the first delay time, the ground select lines GSL are floated. In an exemplary embodiment, a first target voltage V_TG1 is applied to the substrate SUB during the first delay time and, after the first delay time, an erase voltage V_ERS is applied to the substrate SUB. Further, the erase voltage V_ERS may continue to be applied to the substrate SUB until the erase operation has completed.

In an embodiment, the substrate SUB and the surface layer S include a silicon material of a same conductivity type. Therefore, the erase voltage V_ERS applied to the substrate SUB after the first delay time is transferred to the surface layer S. In an exemplary embodiment, the erase voltage V_ERS is higher than the word line erase voltage Vwe.

After the first delay time, the ground select lines GSL and the string select lines SSL are floated. Therefore, when the voltage of the surface layer S is changed, the ground select lines GSL and the string select lines SSL may be influenced by coupling (e.g., a capacitive coupling). In other words, when the voltage of the surface layer S rises to the erase voltage V_ERS, the voltages of the ground select lines GSL and the string select lines SSL may also rise. Therefore, the ground select transistors GST and the string select transistors SST may be erase-inhibited.

The word line erase voltage Vwe is applied to the word lines WL1 through WL8. In an exemplary embodiment, the word line erase voltage Vwe is lower than the erase voltage V_ERS. In an embodiment, the word line erase voltage Vwe is the same as the ground voltage VSS. Due to voltage differences between the surface layer S and the word lines WL1 through WL8, Fowler-Nordheim tunneling occurs in the memory cells MC1 through MC8, and thus the memory cells MC1 through MC8 are erased.

FIG. 6 is a flowchart showing an erase operation of a memory device according to an exemplary embodiment of the inventive concept. FIG. 6 shows an erase operation of the memory device 100 of FIG. 1.

Referring to FIG. 6, a first target voltage (e.g., V_TG1 in FIG. 5) is input as the substrate bias voltage V_SUB to a substrate (e.g., the substrate SUB of FIG. 3) during a first delay time (operation S10). For example, operation S10 may be performed by the substrate bias circuit 150 based on an erase enable signal E_EN. For example, the erase enable signal E_EN may indicate that an erase operation is to be performed. According to an exemplary embodiment, the first target voltage (e.g., V_TG1 in FIG. 5) is input to the substrate as step-pulses.

Next, the substrate bias voltage V_SUB is input to the substrate (e.g., the substrate SUB of FIG. 3) while the level of the substrate bias voltage V_SUB is gradually increased to that of the erase voltage (e.g., the V_ERS in FIG. 5) (operation S20). For example, the substrate bias circuit 150 may ramp up the substrate bias voltage V_SUB from the level of the first target voltage (e.g., V_TG1 in FIG. 5) to that of the erase voltage (e.g., V_ERS in FIG. 5) and output the ramped-up substrate bias voltage V_SUB to the substrate (e.g., the substrate SUB in FIG. 3).

According to an exemplary embodiment, in operation S20, the ground select line GSL is floated. For example, the row decoder 130 may float the ground select line GSL while the substrate bias voltage V_SUB is ramped up, based on the control of the control logic circuit 120.

Figure 7:
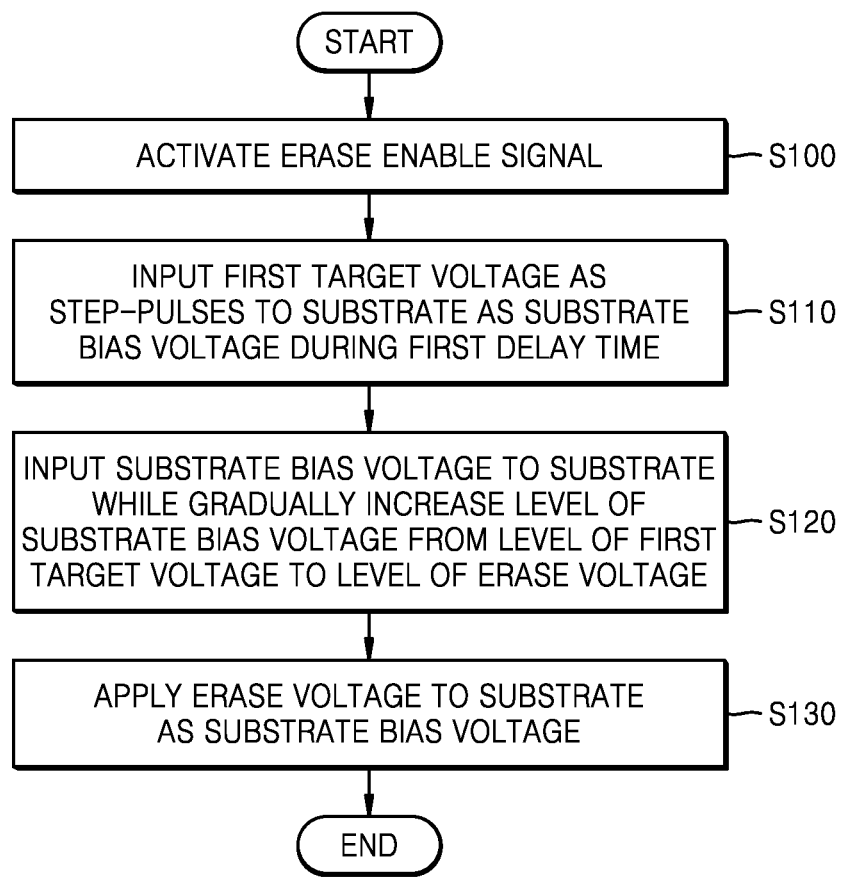
FIG. 7 is a flowchart showing an erase operation of a memory device according to an exemplary embodiment of the inventive concept.

FIG. 7 is a flowchart showing an erase operation of a memory device according to an exemplary embodiment of the inventive concept. FIG. 7 shows an erase operation of the memory device 100 of FIG. 1.

Referring to FIG. 7, an erase enable signal E_EN is activated (operation S100). For example, operation S100 may be performed by the control logic circuit 120 based on a control signal CTRL received from a device outside the memory device 100. In an embodiment, the control logic circuit 120 outputs the erase enable signal initially in a deactivated data, and then sets the ease enable signal to an activated state when it receives a command CMD corresponding to a delete operation.

Next, a first target voltage (e.g., V_TG1 in FIG. 5) as step-pulses is applied to the substrate (e.g., the substrate SUB in FIG. 3) for the first delay time as a substrate bias voltage V_SUB (operation S110). For example, operation S110 may be performed by the substrate bias circuit 150 based on the activated erase enable signal E_EN.

Next, the substrate bias voltage V_SUB is input to the substrate (e.g., the substrate SUB of FIG. 3) while the level of the substrate bias voltage V_SUB is gradually increased to that of the erase voltage (e.g., the V_ERS in FIG. 5) (operation S120). According to an exemplary embodiment, the ground select line GSL is floated in operation S120. Next, an erase voltage (e.g., V_ERS in FIG. 5) is applied to the substrate (e.g., the substrate SUB of FIG. 3) as the substrate bias voltage V_SUB.

Figure 8A:
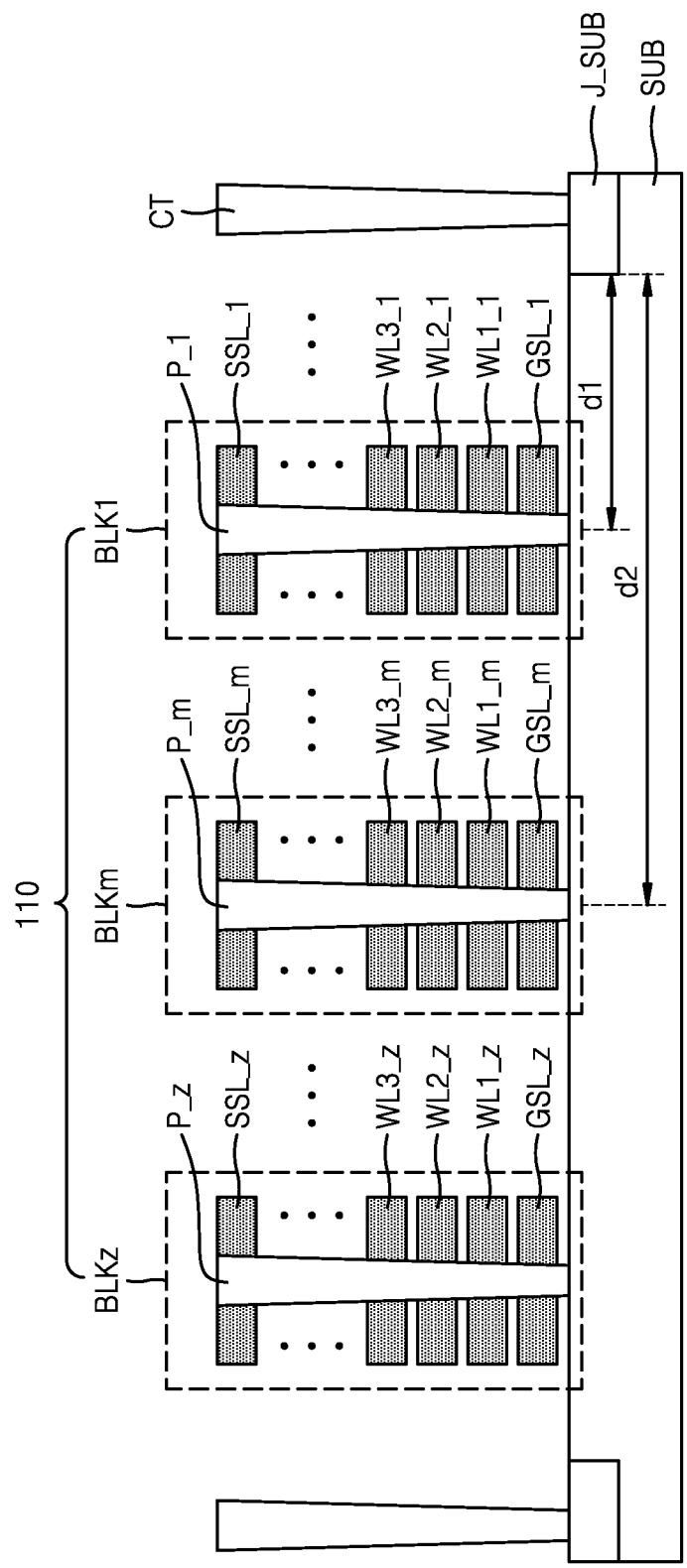
FIGS. 8A through 8C are diagrams for describing a memory device according to an example embodiment and a method of erasing the same.
Figure 8B:
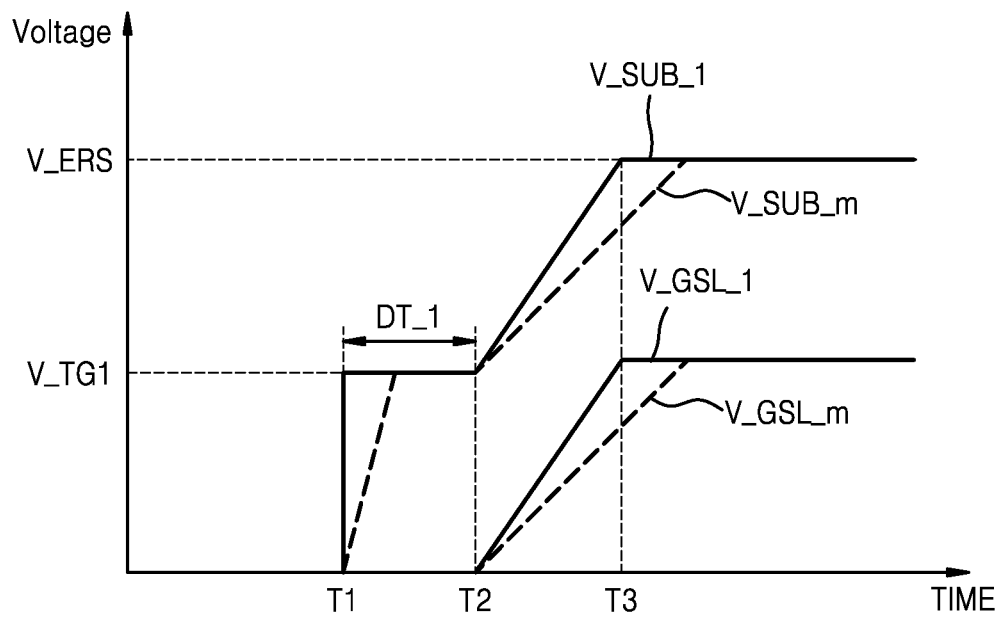
Figure 8C:
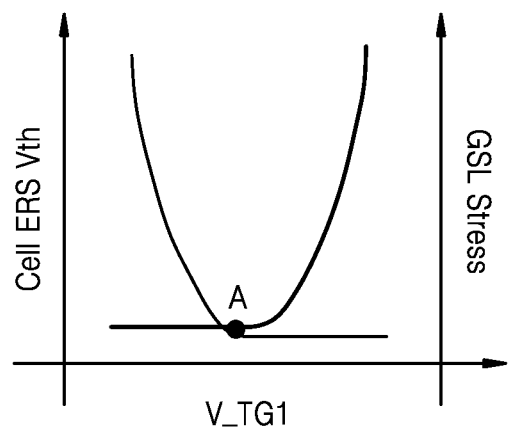

FIGS. 8A through 8C are diagrams for describing a memory device according to an exemplary embodiment and a method of erasing the same. In detail, FIG. 8A briefly shows cross-sectional structures of a memory cell array and a substrate, and FIG. 8B shows a graph showing respective changes of voltages according to time. Furthermore, FIG. 8C shows a graph for describing selection of a first target voltage. For example, FIGS. 8A through 8C may show the memory device 100 of FIG. 1 and an erase operation of the memory device 100.

Referring to FIG. 8A, the memory cell array 110 is disposed on the substrate SUB, and the memory cell array 110 includes the plurality of memory blocks BLK1 through BLKz. Although only the first memory block BLK1, an m-th memory block BLKm, and a z-th memory block BLKz are shown in FIG. 8A, it is merely for convenience of explanation as the inventive concept is not limited thereto. Here, m and z are different natural numbers greater than 1. Furthermore, although FIG. 8A shows that each of the memory blocks BLK1, BLKm, and BLKz includes only one cell string, it is also merely for convenience of explanation as the inventive concept is not limited thereto.

The substrate SUB includes a substrate junction region J_SUB. For example, an upper portion of the substrate SUB may be replaced with the substrate junction region J_SUB. Further, additional substrate junctions may be present at different locations in the substrate SUB. For example, the substrate junction region J_SUB may be doped with an impurity of a conductivity type identical to that of the substrate SUB. In an embodiment, the doping concentration of the substrate junction region J_SUB is higher than the doping concentration of the substrate SUB.

The substrate junction region J_SUB is connected to, for example, one or more contact plugs CT. Although not shown, a contact plug CT may be connected to the substrate bias circuit 150 through a certain wiring. Therefore, the substrate junction region J_SUB may receive the substrate bias voltage V_SUB through the contact plug CT. The contact plug CT may be implemented with a conductive material.

The first memory block BLK1 is located a first distance d1 from the substrate junction region J_SUB. For example, the first memory block BLK1 may be a memory block closest to the substrate junction region J_SUB from among the plurality of memory blocks BLK1 through BLKz. The first memory block BLK1 includes a first pillar P_1, a first ground select line GSL_1, first word lines (e.g., WL1_1, WL2_1, WL3_1), and a first string select line SSL_1.

The m-th memory block BLKm is located a second distance d2 from the substrate junction region J_SUB. The m-th memory block BLKm includes an m-th pillar P_m, an m-th ground select line GSL_m, m-th word lines (e.g., WL1_m, WL2_m, WL3_m), and an m-th string select line SSL_m. In an embodiment, the second distance d2 is greater than the first distance d1. According to an exemplary embodiment, the m-th memory block BLKm is a memory block located at the center from among the memory blocks BLK1 through BLKz. Therefore, when the substrate bias voltage V_SUB is applied to the substrate junction region J_SUB through the contact plug CT, the substrate bias voltage V_SUB reaches a region of the substrate SUB overlapping with the m-th memory block BLKm later than a region of the substrate SUB overlapping with the first memory block BLK1. The z-th memory block BLKz includes a z-th pillar P_z, a z-th ground select line GSL_z, z-th word lines (e.g., WL1_z, WL2_z, WL3_m), and an m-th string select line SSL_m.

Referring to FIG. 8B, for example, the substrate bias circuit 150 outputs the first target voltage V_TG1 as the substrate bias voltage V_SUB to the substrate SUB at a first time point T1. The first time point T1 may be, for example, a time point at which the erase enable signal E_EN output by the control logic circuit 120 is activated.

According to an exemplary embodiment, at the first time point T1, the substrate bias circuit 150 outputs the first target voltage V_TG1 as step-pulses to the substrate SUB. Furthermore, according to an exemplary embodiment, the substrate bias circuit 150 outputs the first target voltage V_TG1 to the substrate SUB during a first delay time DT_1.

According to an exemplary embodiment, the first delay time DT_1 is set based on the second distance d2. For example, when the m-th memory block BLKm is a memory block located at the center from among the plurality of memory blocks BLK1 through BLKz, the rate at which a substrate bias voltage V_SUB_m applied to the region of the substrate SUB overlapping with the m-th memory block BLKm may be slowest. Therefore, the first delay time DT_1 may be sufficiently set for the substrate bias voltage V_SUB_m to reach the first target voltage V_TG1. For example, an RC time constant regarding a path for transferring the substrate bias voltage V_SUB_m may be determined according to the second distance d2, and the first delay time DT_1 may be set based on the RC time constant. Referring to FIG. 8C, the erase threshold voltage of each memory cell and stress of a ground select line may be changed according to the level of the first target voltage V_TG1. For example, as the level of the first target voltage V_TG1 decreases, the erase threshold voltage of each memory cell is increased and the stress of the ground select line is lowered. Furthermore, as the level of the first target voltage V_TG1 increases, the erase threshold voltage of each memory cell is lowered and the stress of the ground select line is increased. In other words, the erase threshold voltage of each memory cell and the stress of the ground select line according to the level of the first target voltage V_TG1 may have a trade-off relationship.

Therefore, the level of the first target voltage V_TG_1 may be set by taking the erase threshold voltage of each memory cell and the stress of the ground select line into account. For example, the first target voltage V_TG_1 may be set based on a point A where a graph of the erase threshold voltages of each memory cell according to the first target voltage V_TG_1 meets a stress graph of the ground select line.

Referring back to FIGS. 8A and 8B, the substrate bias voltage V_SUB_m of the region of the substrate SUB overlapping with the m-th memory block BLKm may reach the first target voltage V_TG1 later than a substrate bias voltage V_SUB_1 of the region of the substrate SUB overlapping with the first memory block BLK1. However, since the substrate bias circuit 150 outputs the first target voltage V_TG1 to the substrate SUB during an optimized first delay time DT_1, the substrate bias voltage V_SUB_m reaches the first target voltage V_TG1 within the first delay time DT_1, After the first delay time DT_1, at a second time point T2, the substrate bias circuit 150 gradually increases the substrate bias voltage V_SUB_1 from the level of the first target voltage V_TG1 to the level of the erase voltage V_ERS and outputs the substrate bias voltage V_SUB_1 to the substrate SUB. At the second time point T2, for example, the row decoder 130 may float ground select lines GSL_1 through GSL_z based on the control of the control logic circuit 120. Therefore, a voltage V_GSL_1 of the ground select line included in the first memory block BLK1 may be coupled to the substrate bias voltage V_SUB_1, and a voltage V_GSL_m of the ground select line included in the m-th memory block BLKm may be coupled to the substrate bias voltage V_SUB_m. Although it is described that the ground select lines GSL_1 through GSL_z are floated at the second time point T2, that is, after the first delay time DT_1, the inventive concept is not limited thereto as the ground select lines GSL_1 through GSL_z may be floated during the delay time DT_1. For example, time points at which ground select lines GSL_1 through GSL_z start to be floated are not limited to time points after the first delay time DT_1. For example, the ground select lines GSL_1 through GSL_z may start to be floated during the first delay time DT_1 and may also be floated for a certain time period after the first delay time DT_1. Furthermore, according to another exemplary embodiment, at the second time point T2, the substrate bias circuit 150 applies step-pulses, thereby increasing the level of the substrate bias voltage V_SUB_1 from the level of the first target voltage V_TG1 to the level of the erase voltage V_ERS and outputs the substrate bias voltage V_SUB_1 to the substrate SUB.

At a third time point T3, the substrate bias voltage V_SUB_1 output by the substrate bias circuit 150 reaches the erase voltage V_ERS. Subsequently, the substrate bias circuit 150 outputs the erase voltage V_ERS to the substrate SUB as the substrate bias voltage V_SUB_1 until an erase operation has completed.

According to an exemplary embodiment, as the first target voltage V_TG1 is applied to the substrate SUB for the first delay time DT_1 during an erase operation, substrate bias voltages applied to regions of the substrate SUB overlapping with respective memory blocks reach a same level and then are ramped up. For example, in a COP structure, even when the substrate SUB includes poly-silicon doped with a first conductivity type (e.g., p-type), substrate bias voltages applied to regions of the substrate SUB overlapping with different memory blocks (e.g., BLK1 and BLKm) all reach a same level and then are ramped up. Therefore, after the substrate bias voltage V_SUB_m reaches the erase voltage V_ERS, the voltages of the ground select lines included in the respective memory blocks may have levels substantially identical to one another. Therefore, the reliability of the erase operation may be improved. Furthermore, by applying the first target voltage V_TG1 as step-pulses, the speed of the erase operation may be improved.

Meanwhile, according to an exemplary embodiment, the memory cell array 110 may include a plurality of planes each including a plurality of blocks BLK1 through BLKz. Also, the memory device 100 may be implemented to perform a multi-plane block erase operation. The multi-plane block erase operation is an operation of erasing two or more different blocks included in each of two or more different planes in parallel in response to one multi-plane block erase command. For example, the memory device 100 may erase the first block BLK1 included in the first plane and the first block BLK1 included in the second plane in parallel in response to a multi-plane erase command. However, a combination of blocks erased in parallel according to a multi-plane block erase command is not limited to the above-described example.

When the memory device 100 performs the multi-plane block erase operation, the above-described embodiment may be applied. For example, when the memory device 100 erases the first block BLK1 included in the first plane and the first block BLK1 included in the second plane in parallel, operations of S10 and S20 described above may be performed for each of the first block BLK1 of the first plane and the first block BLK1 of the second plane in parallel.

Meanwhile, since a distance from the substrate junction region J_SUB may be different for each of the plurality of planes, at least one of among the first delay time DT_1, the first target voltage V_TG1 and the erase voltage V_ERS of each plane may be different from each other. Specifically, at least one of the first delay time DT_1, the first target voltage V_TG1, and the erase voltage V_ERS of each of the plurality of planes may be set based on the distance from the substrate junction region J_SUB.

For example, the first target voltage V_TG1 and the erase voltage V_ERS may be applied to the first plane through the first substrate junction region, and may be applied to the second plane through the second substrate junction region. When the distance between the first plane and the first substrate junction region is less than the distance between the second plane and the second substrate junction region, the time for the first target voltage V_TG1 or the erase voltage V_ERS to reach the blocks of the second plain may be longer, and a voltage loss due to the resistance may be greater. Accordingly, at least one of the first delay time DT_1, the first target voltage V_TG1, and the erase voltage V_ERS of the second plane may be set to be longer (or bigger) than the first delay time DT_1, the first target voltage V_TG1, and the erase voltage (V_ERS) of the first plane.

According to a modified embodiment, the memory device 100 includes a common source lines CSL formed in a plate shape on the substrate SUB and the plurality of blocks BLK1 through BLKz extending in a vertical direction from an upper portion of the common source lines CSL. The common source line CSL may be electrically connected to the common source line contact plug. In addition, the memory device 100 may perform an erase operation according to the above-described embodiment.

For example, a target voltage (eg, V_TG1 in FIG. 5) may be applied to the common source line CSL for a delay time as a common source line voltage through the common source line contact plug. In addition, the common source line voltage is input to the common source line while the level of the common source line voltage is gradually increased from the target voltage (eg, V_TG1 in FIG. 5) to the erase voltage (eg, V_ERS in FIG. 5). In this case, a ground select line voltage is applied to the ground select line GSL, and the ground select line voltage may have a voltage level lower than the erase voltage by a predetermined voltage. The memory device 100 may include a voltage generating circuit, and the voltage generating circuit may generate a common source line voltage and the ground select line voltage according to the control signal of the control logic circuit 120.

Figure 9A:
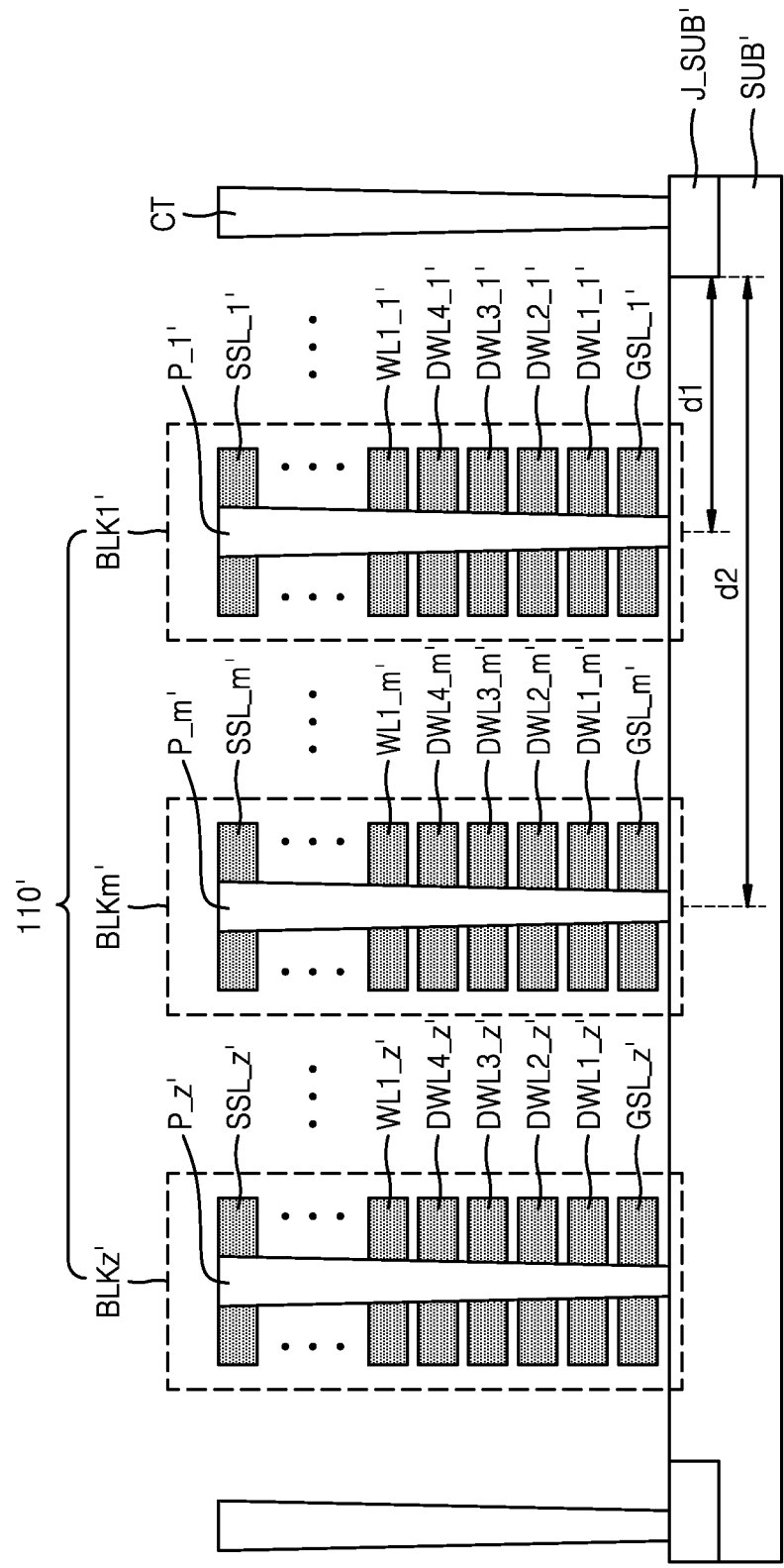
FIGS. 9A and 9B are diagrams for describing a memory device according to an example embodiment and a method of erasing the same.
Figure 9B:
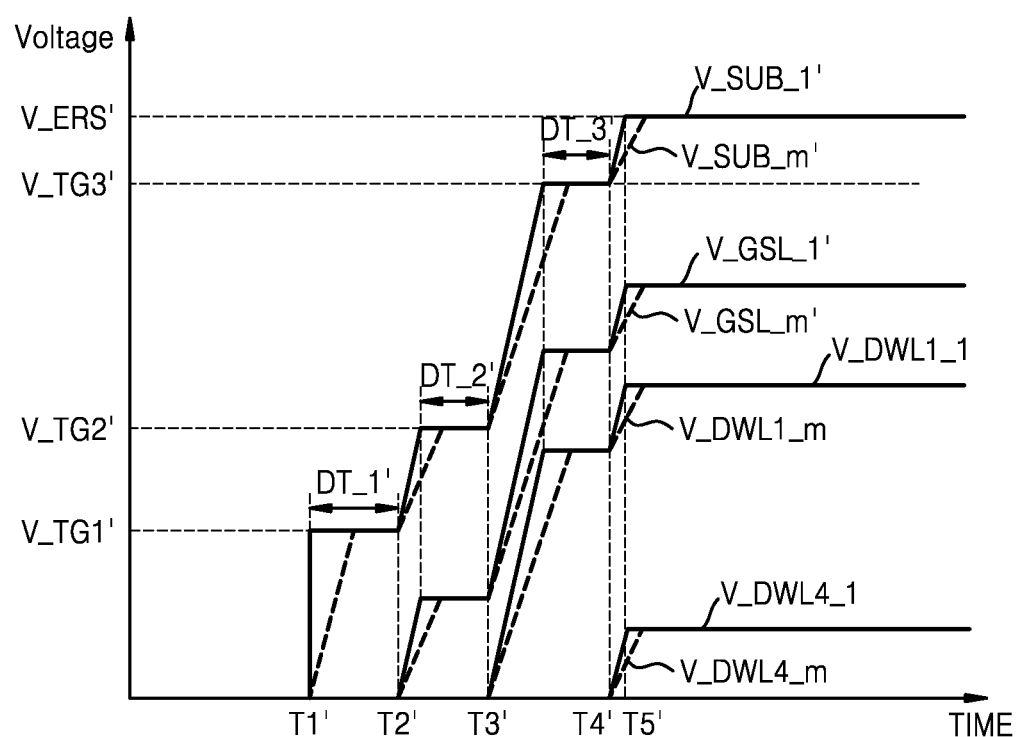

FIGS. 9A and 9B are diagrams for describing a memory device according to an exemplary embodiment and a method of erasing the same. In detail, FIG. 9A briefly shows cross-sectional structures of a memory cell array and a substrate, and FIG. 9B shows a graph showing respective changes of voltages according to time. Descriptions identical to those given above with reference to FIGS. 8A and 8B will be omitted. Furthermore, unless described otherwise, the descriptions given above with reference to FIG. 1 also apply to the description given with reference to FIGS. 9A and 9B.

Referring to FIG. 9A, a memory cell array 110' includes one or more dummy word lines disposed between a word line and a ground select line. For example, a first memory block BLK1' includes first through fourth dummy word lines DWL1_1' through DWL4_1' between a first word line WL1_1' and a first ground select line GSL_1', an m-th memory block BLKm' includes first through fourth dummy word lines DWL1_m' through DWL4_m' between an m-th word line WL1_m' and an m-th ground select line GSL_m', and a z-th memory block BLKz' includes first through fourth dummy word lines DWL1_z' through DWL4_z' between a z-th word line WL1_z' and a z-th ground select line GSL_z'. Although four dummy word lines are illustrated in each memory block in FIG. 9A, the inventive concept is not limited thereto. Memory blocks other than the first memory block BLK1' may also have the same configuration as the first memory block BLK1'. Further, the first memory block BLK1' includes a first pillar P_1', the m-th memory block BLKm' includes a p-th pillar P_m', and the z-th memory block BLKz' includes a z-th pillar P_z'. At least one substrate junction region J_SUB is disposed in the substrate SUB' of the memory cell array 110'.

Referring to FIG. 9B, for example, the substrate bias circuit 150 outputs a first target voltage V_TG1' to a substrate SUB' as the substrate bias voltage V_SUB at a first time point T1'. For example, the target voltage V_TG1' may be applied to the substrate junction region J_SUB'. According to an exemplary embodiment, the substrate bias circuit 150 outputs the first target voltage V_TG1' to the substrate SUB during the first delay time DT_1'.

After the first delay time DT_1', at a second time point T2', the substrate bias circuit 150 gradually increases the substrate bias voltage V_SUB_1' from the level of the first target voltage V_TG1' to the level of a second target voltage V_TG2' and outputs the substrate bias voltage V_SUB_1' to the substrate SUB. In an embodiment, the level of the second target voltage V_TG2' is lower than the level of an erase voltage V_ERS'. Furthermore, at the second time point T2', for example, the row decoder 130 may float ground select lines GSL_1' and GSL_m' based on the control of the control logic circuit 120.

When the substrate bias voltage V_SUB_1' reaches the second target voltage V_TG2', the substrate bias circuit 150 outputs the second target voltage V_TG2' to the substrate SUB as the substrate bias voltage V_SUB_1' during a second delay time DT_2'. According to an exemplary embodiment, the second delay time DT_2' is set based on a second distance d2'. For example, the second delay time DT_2' may be set sufficiently for a substrate bias voltage V_SUB_m' of a region of the substrate SUB overlapping with an m-th memory block BLKm' to reach the second target voltage V_TG2'.

After the second delay time DT_2', at a third time point T3', the substrate bias circuit 150 gradually increases the substrate bias voltage V_SUB from the level of the second target voltage V_TG2' to the level of a third target voltage V_TG3' and outputs the substrate bias voltage V_SUB_1' to the substrate SUB. In an embodiment, the level of the third target voltage V_TG3' is lower than the level of the erase voltage V_ERS'.

Furthermore, at the third time point T3', for example, the row decoder 130 may float first dummy word lines DWL1_1' and DWL_1_m' based on the control of the control logic circuit 120. Therefore, a voltage V_DWL1_1 of the first dummy word line DWL1_1' included in the first memory block BLK1' may be coupled to a substrate bias voltage V_SUB_1' and a voltage V_DWL1_m of the first dummy word line DWL1_m' may be coupled to the substrate bias voltage V_SUB_m'.

When the substrate bias voltage V_SUB reaches the third target voltage V_TG3', the substrate bias circuit 150 outputs the third target voltage V_TG3' to the substrate SUB as the substrate bias voltage V_SUB during a third delay time DT_3'. According to an exemplary embodiment, the third delay time DT_3' is set based on the second distance d2'. For example, the third delay time DT_3' may be set sufficiently for a substrate bias voltage V_SUB_m' of a region of the substrate SUB overlapping with an m-th memory block BLKm' to reach the third target voltage V_TG3'.

After the third delay time DT_3', at a fourth time point T4', the substrate bias circuit 150 gradually increases the substrate bias voltage V_SUB from the level of the third target voltage V_TG3' to the erase voltage V_ERS' and outputs the substrate bias voltage V_SUB_1 ' to the substrate SUB. Furthermore, at the fourth time point T4', for example, the row decoder 130 may float fourth dummy word lines DWL4_1' and DWL4_m' based on the control of the control logic circuit 120. Therefore, a voltage V_DWL4_1 of the fourth dummy word line DWL4_1' included in the first memory block BLK1' may be coupled to the substrate bias voltage V_SUB_1' and a voltage V_DWL4_m of the first dummy word line DWL4_m' may be coupled to the substrate bias voltage V_SUB_m'.

According to an exemplary embodiment, when each of the memory blocks BLK1' through BLKz' includes a plurality of dummy word lines, the row decoder 130 may float a dummy word line closest to a ground select line and a dummy word line closest to a word line from among the plurality of dummy word lines, based on the control of the control logic circuit 120. Furthermore, from among the plurality of dummy word lines, dummy word lines other than the dummy word line closest to the ground select line and the dummy word line closest to the word line may be applied with, for example, a word line erase voltage (Vwe in FIG. 5).

At a fifth time point T5', the substrate bias voltage V_SUB_1' reaches the erase voltage V_ERS'. Subsequently, the substrate bias circuit 150 outputs the erase voltage V_ERS' to the substrate SUB as the substrate bias voltage V_SUB_1' until the erase operation has completed.

According to an exemplary embodiment, the memory device 100 may be implemented to perform a multi-plane erase operation. When the memory device 100 performs the multi-plane block erase operation, the above-described embodiment may be applied. Meanwhile, since the distance from the substrate junction region J_SUB may be different for each of the plurality of planes, at least one of among the first delay time DT_1' through the third delay time DT_3' and the first target voltage V_TG1' through the third target voltage V_TG3' and the erase voltage V_ERS' of each plane may be different from each other.

Figure 10:
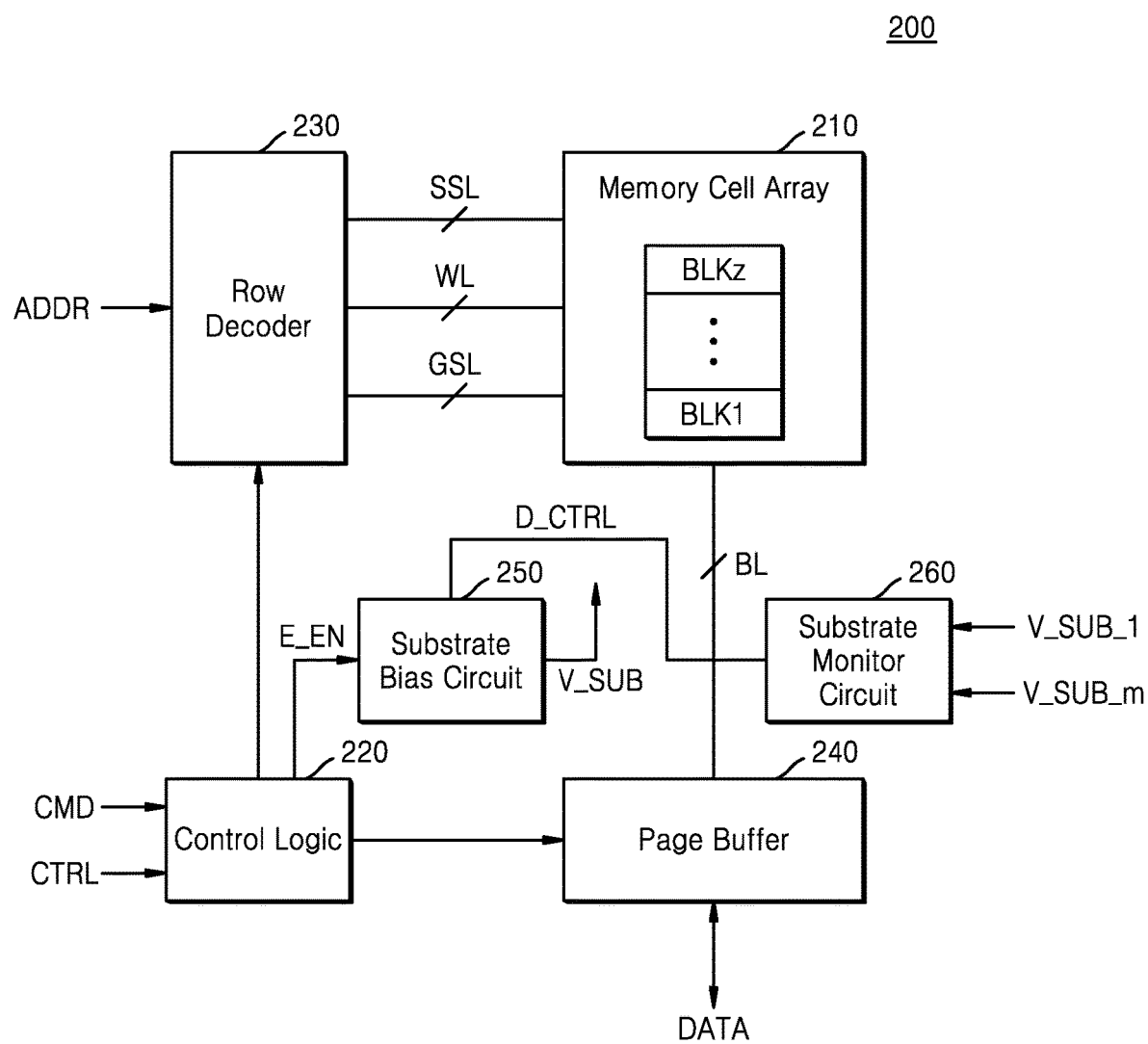
FIG. 10 is a block diagram showing a memory device according to an exemplary embodiment of the inventive concept.

FIG. 10 is a block diagram showing a memory device according to another exemplary embodiment of the inventive concept. Descriptions identical to those given above with reference to FIG. 1 will be omitted.

Referring to FIG. 10, a memory device 200 further includes a substrate monitoring circuit 260. The substrate monitoring circuit 260 monitors voltages applied to a substrate (e.g., the substrate SUB of FIG. 3) and outputs a delay control signal D_CTRL based thereon.

According to an exemplary embodiment, the substrate monitoring circuit 260 monitors a substrate bias voltage V_SUB_1 of a region of the substrate (e.g., the substrate SUB of FIG. 3) overlapping with a first memory block (e.g., BLK1 in FIG. 8A) and a substrate bias voltage V_SUB_m of a region of the substrate (e.g., the substrate SUB of FIG. 3) overlapping with an m-th memory block (e.g., BLKm in FIG. 8A) and outputs the delay control signal D_CTRL based on the substrate bias voltages V_SUB_1 and V_SUB_m.

The substrate bias circuit 250 outputs a substrate bias voltage V_SUB based on the erase enable signal E_EN output from the control logic circuit 220 and the delay control signal D_CTRL output from the circuit monitoring circuit 260. According to an exemplary embodiment, in response to the erase enable signal E_EN, the substrate bias circuit 250 generates a first target voltage during the first delay time as the substrate bias voltage V_SUB regarding the substrate (e.g., the substrate SUB of FIG. 3) supporting the memory cell array 210. In an embodiment, the first delay time is set based on the delay control signal D_CTRL.

Figure 11:
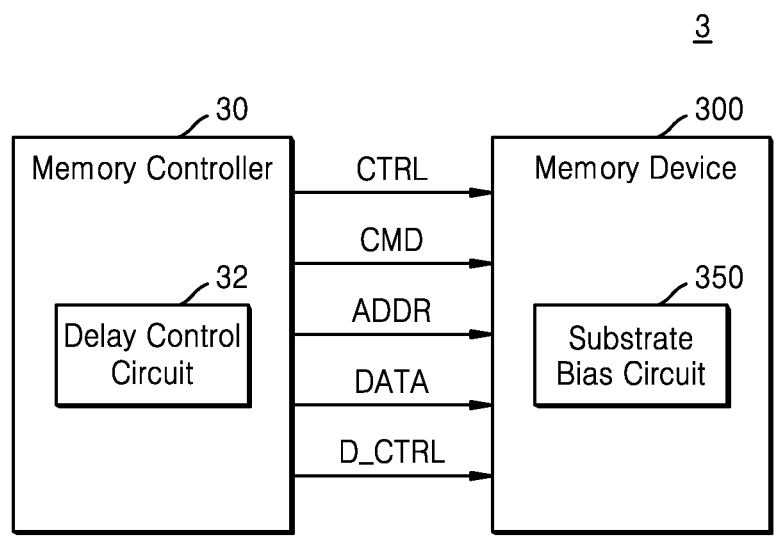
FIG. 11 is a block diagram showing a memory system according to an exemplary embodiment of the inventive concept.

FIG. 11 is a block diagram showing a memory system according to an exemplary embodiment of the inventive concept.

Referring to FIG. 11, a memory system 3 includes a memory controller 30 and a memory device 300. The memory controller 30 includes a delay control circuit 32, and the memory device 300 includes a substrate bias circuit 350. The memory device 300 may be implemented, for example, in a form substantially similar to that of the memory device 100 shown in FIG. 1.

The memory controller 30 may be connected to a host HOST and the memory device 300. In response to a request from the host HOST, the memory controller 30 may be configured to access the memory device 300. For example, the memory controller 30 may be configured to control program, read, erase, and background operations regarding the memory device 300. In an embodiment, the memory controller 30 provides an address ADDR, a command CMD, and a control signal CTRL to the memory device 300, thereby controlling program, read, and erase operations regarding the memory device 300. Furthermore, data DATA for a program operation and read-out data DATA may be transmitted and received between the memory controller 30 and the memory device 300.

Although not shown, the memory controller 30 may include a RAM, a processing unit, a host interface, and a memory interface. The RAM may be used as an operation memory of the processing unit, and the processing unit may control operations of the memory controller 30. The host interface may include a protocol for performing data exchange between the host HOST and the memory controller 30. For example, the memory controller 30 may be configured to communicate with the host (HOST) via at least one of various interface protocols such as USB, MMC, PCI-E, advanced technology attachment (ATA), serial-ATA, parallel-ATA, SCSI, ESDI, and integrated drive electronics.

According to an exemplary embodiment, the delay control circuit 32 outputs a delay control signal D_CTRL to control a delay time regarding the substrate bias voltage V_SUB during an erase operation of the memory device 300. In an exemplary embodiment, the substrate bias circuit 350 included in the memory device 300 outputs a first target voltage as the substrate bias voltage V_SUB during a first delay time based on the delay control signal D_CTRL and, after the first delay time, gradually increases the level of the substrate bias voltage V_SUB to that of an erase voltage and outputs the substrate bias voltage V_SUB to the substrate. Although it is described that the delay control signal D_CTRL is separate from the control signal CTRL, the delay control signal D_CTRL may also be included in the control signal CTRL and provided to the memory device 300.

Figure 12:
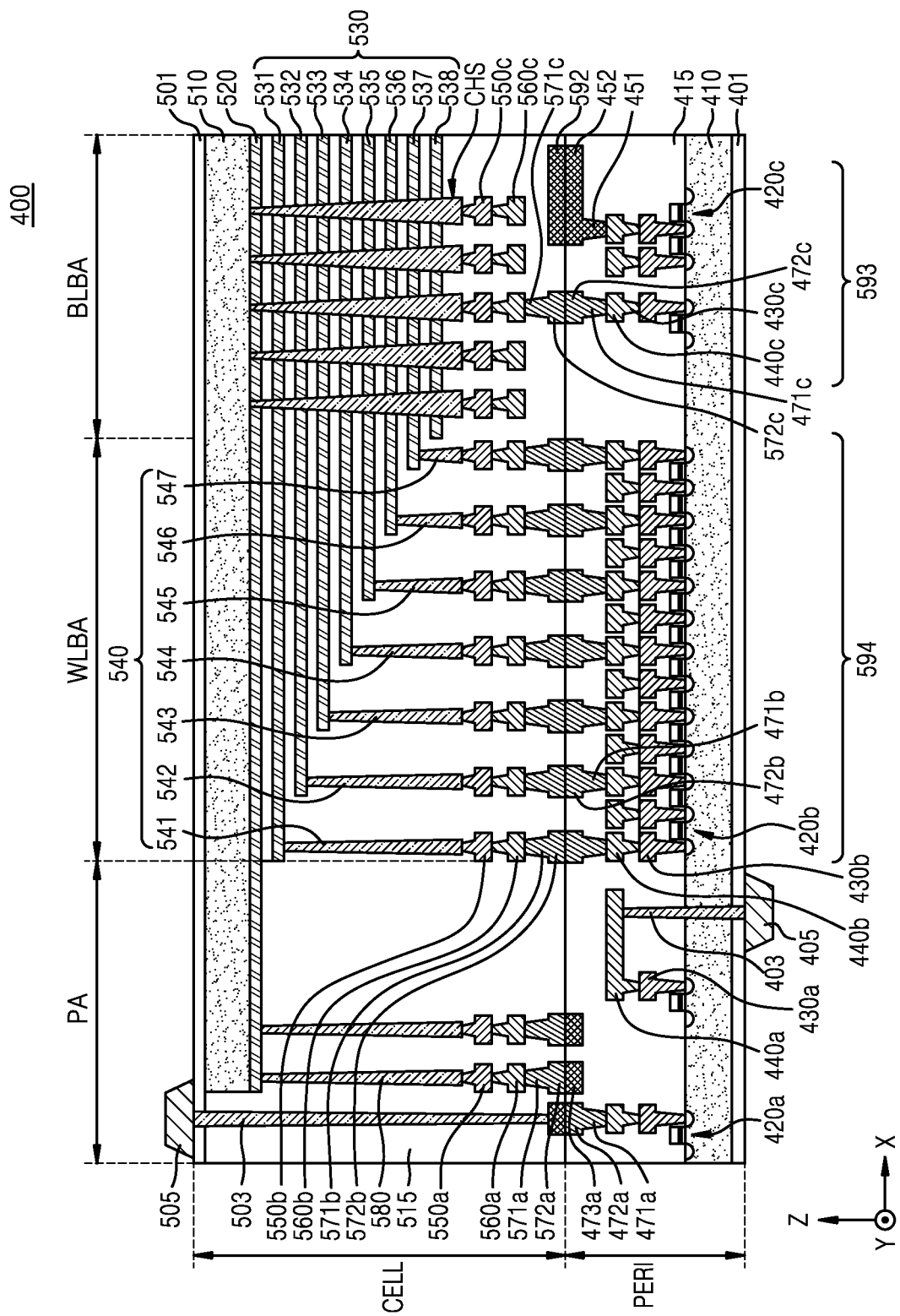
FIG. 12 is a diagram showing the structure of a memory device according to an exemplary embodiment of the inventive concept.

FIG. 12 is a diagram showing the structure of a memory device 400 according to an exemplary embodiment of the inventive concept.

Referring to FIG. 12, a memory device 400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminium or tungsten.

Each of the peripheral circuit region PERI and the cell region CELL of the memory device 400 may include an external pad bonding area PA, a word line bonding area WLBA, and a bit line bonding area BLBA.

The peripheral circuit region PERI may include a first substrate 410, an interlayer insulating layer 415, a plurality of circuit elements 420a, 420b, and 420c formed on the first substrate 410, first metal layers 430a, 430b, and 430c respectively connected to the plurality of circuit elements 420a, 420b, and 420c, and second metal layers 440a, 440b, and 440c formed on the first metal layers 430a, 430b, and 430c. In an example embodiment, the first metal layers 430a, 430b, and 430c may be formed of tungsten having relatively high resistance, and the second metal layers 440a, 440b, and 440c may be formed of copper having relatively low resistance.

In an example embodiment illustrate in FIG. 12, although the first metal layers 430a, 430b, and 430c and the second metal layers 440a, 440b, and 440c are shown and described, they are not limited thereto, and one or more metal layers may be further formed on the second metal layers 440a, 440b, and 440c. At least a portion of the one or more metal layers formed on the second metal layers 440a, 440b, and 440c may be formed of aluminium or the like having a lower resistance than those of copper forming the second metal layers 440a, 440b, and 440c.

The interlayer insulating layer 415 may be disposed on the first substrate 410 and cover the plurality of circuit elements 420a, 420b, and 420c, the first metal layers 430a, 430b, and 430c, and the second metal layers 440a, 440b, and 440c. The interlayer insulating layer 415 may include an insulating material such as silicon oxide, silicon nitride, or the like.

Lower bonding metals 471b and 472b may be formed on the second metal layer 440b in the word line bonding area WLBA. In the word line bonding area WLBA, the lower bonding metals 471b and 472b in the peripheral circuit region PERI may be electrically connected to c in a bonding manner, and the lower bonding metals 471b and 472b and the upper bonding metals 571b and 572b may be formed of aluminium, copper, tungsten, or the like. Further, the upper bonding metals 571b and 572b in the cell region CELL may be referred as first metal pads and the lower bonding metals 471b and 472b in the peripheral circuit region PERI may be referred as second metal pads.

The cell region CELL may include at least one memory block. The cell region CELL may include a second substrate 510 and a common source line 520. On the second substrate 510, a plurality of word lines 531 to 538 (i.e., 530) may be stacked in a direction (a Z-axis direction), perpendicular to an upper surface of the second substrate 510. At least one string select line and at least one ground select line may be arranged on and below the plurality of word lines 530, respectively, and the plurality of word lines 530 may be disposed between the at least one string select line and the at least one ground select line.

In the bit line bonding area BLBA, a channel structure CH may extend in a direction, perpendicular to the upper surface of the second substrate 510, and pass through the plurality of word lines 530, the at least one string select line, and the at least one ground select line. The channel structure CH may include a data storage layer, a channel layer, a buried insulating layer, and the like, and the channel layer may be electrically connected to a first metal layer 550c and a second metal layer 560c. For example, the first metal layer 550c may be a bit line contact, and the second metal layer 560c may be a bit line. In an example embodiment, the bit line 560c may extend in a first direction (a Y-axis direction), parallel to the upper surface of the second substrate 510.

In an example embodiment illustrated in FIG. 12, an area in which the channel structure CH, the bit line 560c, and the like are disposed may be defined as the bit line bonding area BLBA. In the bit line bonding area BLBA, the bit line 560c may be electrically connected to the circuit elements 420c providing a page buffer 593 in the peripheral circuit region PERI. For example, the bit line 560c may be connected to upper bonding metals 571c and 572c in the cell region CELL, and the upper bonding metals 571c and 572c may be connected to lower bonding metals 471c and 472c connected to the circuit elements 420c of the page buffer 593.

In the word line bonding area WLBA, the plurality of word lines 530 may extend in a second direction (an X-axis direction), parallel to the upper surface of the second substrate 510, and may be connected to a plurality of cell contact plugs 541 to 547 (i.e., 540). The plurality of word lines 530 and the plurality of cell contact plugs 540 may be connected to each other in pads provided by at least a portion of the plurality of word lines 530 extending in different lengths in the second direction. A first metal layer 550b and a second metal layer 560b may be connected to an upper portion of the plurality of cell contact plugs 540 connected to the plurality of word lines 530, sequentially. The plurality of cell contact plugs 540 may be connected to the circuit region PERI by the upper bonding metals 571b and 572b of the cell region CELL and the lower bonding metals 471b and 472b of the peripheral circuit region PERI in the word line bonding area WLBA.

The plurality of cell contact plugs 540 may be electrically connected to the circuit elements 420b providing a row decoder 594 in the peripheral circuit region PERI. In an example embodiment, operating voltages of the circuit elements 420b providing the row decoder 594 may be different than operating voltages of the circuit elements 420c providing the page buffer 593. For example, operating voltages of the circuit elements 420c providing the page buffer 593 may be greater than operating voltages of the circuit elements 420b providing the row decoder 594.

A common source line contact plug 580 may be disposed in the external pad bonding area PA. The common source line contact plug 580 may be formed of a conductive material such as a metal, a metal compound, polysilicon, or the like, and may be electrically connected to the common source line 520. A first metal layer 550a and a second metal layer 560a may be stacked on an upper portion of the common source line contact plug 580, sequentially. For example, an area in which the common source line contact plug 580, the first metal layer 550a, and the second metal layer 560a are disposed may be defined as the external pad bonding area PA.

Input-output pads 405 and 505 may be disposed in the external pad bonding area PA. Referring to FIG. 12, a lower insulating film 401 covering a lower surface of the first substrate 410 may be formed below the first substrate 410, and a first input-output pad 405 may be formed on the lower insulating film 401. The first input-output pad 405 may be connected to at least one of the plurality of circuit elements 420a, 420b, and 420c disposed in the peripheral circuit region PERI through a first input-output contact plug 403, and may be separated from the first substrate 410 by the lower insulating film 401. In addition, a side insulating film may be disposed between the first input-output contact plug 403 and the first substrate 410 to electrically separate the first input-output contact plug 403 and the first substrate 410.

Referring to FIG. 12, an upper insulating film 501 covering the upper surface of the second substrate 510 may be formed on the second substrate 510, and a second input-output pad 505 may be disposed on the upper insulating layer 501. The second input-output pad 505 may be connected to at least one of the plurality of circuit elements 420a, 420b, and 420c disposed in the peripheral circuit region PERI through a second input-output contact plug 503.

According to embodiments, the second substrate 510 and the common source line 520 may not be disposed in an area in which the second input-output contact plug 503 is disposed. Also, the second input-output pad 505 may not overlap the word lines 530 in the third direction (the Z-axis direction). Referring to FIG. 12, the second input-output contact plug 503 may be separated from the second substrate 510 in a direction, parallel to the upper surface of the second substrate 510, and may pass through the interlayer insulating layer 515 of the cell region CELL to be connected to the second input-output pad 505.

According to embodiments, the first input-output pad 405 and the second input-output pad 505 may be selectively formed. For example, the memory device 400 may include only the first input-output pad 405 disposed on the first substrate 410 or the second input-output pad 505 disposed on the second substrate 510. Alternatively, the memory device 400 may include both the first input-output pad 405 and the second input-output pad 505.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 400 may include a lower metal pattern 473a, corresponding to an upper metal pattern 572a formed in an uppermost metal layer of the cell region CELL, and having the same shape as the upper metal pattern 572a of the cell region CELL, in an uppermost metal layer of the peripheral circuit region PERI. In the peripheral circuit region PERI, the lower metal pattern 473a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 471b and 472b may be formed on the second metal layer 440b in the word line bonding area WLBA. In the word line bonding area WLBA, the lower bonding metals 471b and 472b of the peripheral circuit region PERI may be electrically connected to the upper bonding metals 571b and 572b of the cell region CELL by a Cu—Cu bonding.

Further, the bit line bonding area BLBA, an upper metal pattern 592, corresponding to a lower metal pattern 452 formed in the uppermost metal layer of the peripheral circuit region PERI, and having the same shape as the lower metal pattern 452 of the peripheral circuit region PERI, may be formed in an uppermost metal layer of the cell region CELL. A contact may not be formed on the upper metal pattern 592 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

According to a present exemplary embodiment of the inventive concept, the memory device 400 may be implemented according to the exemplary embodiments described above with reference to FIGS. 1 to 11. For example, the memory device 400 may include memory cell arrays 110 and 210 in the cell region CELL. The substrate SUB supporting the memory cell arrays 110 and 210 may correspond to the second substrate 510 in the cell region CELL. In addition, the memory device 400 may include the substrate bias circuits 150 and 250 and/or the substrate monitor circuit 260 in the peripheral circuit region PERI. In addition, although not shown in FIG. 12, the substrate SUB may include a substrate junction region J_SUB, and the substrate junction region J_SUB may be connected to the substrate bias circuits 150 and 250 through a contact plug. The operation of the memory device 400 may be performed substantially identical to the above-described embodiments with reference to FIGS. 1 to 11, and a description identical to those given above with reference to FIGS. 1 to 11 will be omitted.

Meanwhile, according to a modified embodiment, the memory device 400 may perform the erase operation according to the above-described embodiment using the common source line 520 and the common source line contact plug 580.

For example, a target voltage (eg, V_TG1 in FIG. 5) may be applied to the common source line 520 for a delay time as a common source line voltage through the common source line contact plug 580. In addition, the common source line voltage is input to the common source line 520 while the level of the common source line voltage is gradually increased from the target voltage (eg, V_TG1 in FIG. 5) to the erase voltage (eg, V_ERS in FIG. 5). In this case, a ground select line voltage is applied to the ground select line GSL, and the ground select line voltage may have a voltage level lower than the erase voltage by a predetermined voltage.

The peripheral circuit region PERI may include the control logic circuit 120 and the voltage generating circuit of FIG. 1, and the voltage generating circuit may generate the common source line voltage and the ground select line voltage according to the control signal of the control logic circuit 120. The ground select line voltage may be applied to the ground select line GSL through a pad that electrically connects the voltage generating circuit and the ground select line GSL FIG. 13 is a diagram showing the structure of a memory device 600 according to an exemplary embodiment of the inventive concept.

Figure 13:
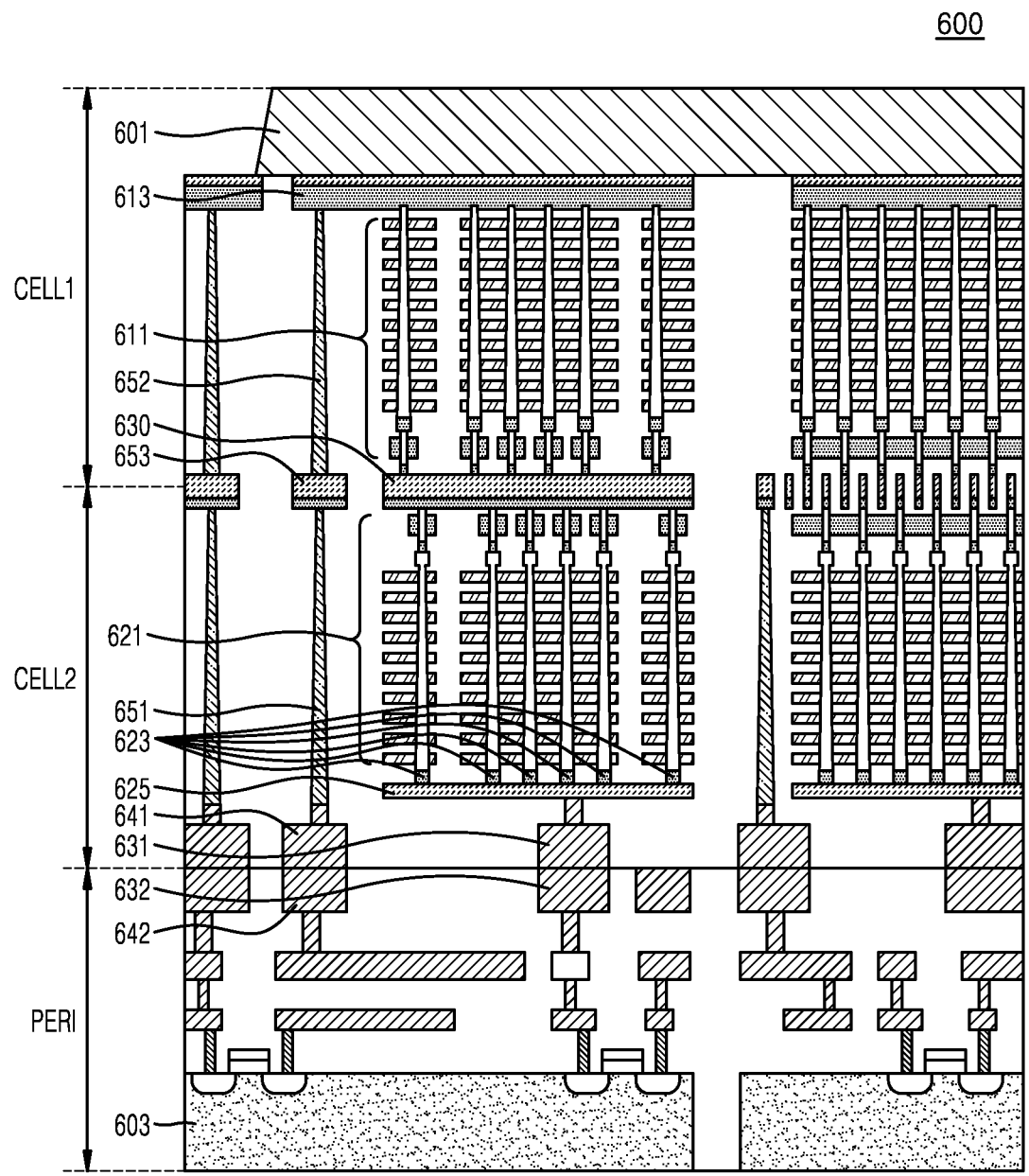
FIG. 13 is a diagram showing the structure of a memory device according to an exemplary embodiment of the inventive concept.

Referring to FIG. 13, unlike the memory device 400 of FIG. 12, the memory device 600 may include two or more upper chips, each including a cell region. For example, the memory device 600 may include a first upper chip including a first cell region CELL1, a second upper chip including a second cell region CELL2, and a lower chip including a peripheral circuit region PERI. The first upper chip, the second upper chip and the lower chip may be connected by a bonding method. However, the number of upper chips is not limited to thereto. Hereinafter, the above-described description through FIG. 12 may be omitted. Hereinafter, the cell region CELL may refer to at least one of the first cell region CELL1 and the second cell region CELL2.

The first cell region CELL1 may include a first substrate 601 and a first common source line 613. On the first substrate 601, first cell strings 611 may be disposed along a direction perpendicular to an upper surface of the first substrate 601, and the first cell strings 611 may include ground selection lines, wordlines and string selection lines. Ground selection lines of the first cell strings 611 may be electrically connected to the first common source line 613. The first cell area CELL1 may include a first contact plug 652 electrically connected to the first common source line 613 and the bit line pad 653.

The second cell area CELL2 may include a bonding pad 625 and a second common source line 623. On the bonding pad 625, second cell strings 621 may be disposed along a direction perpendicular to an upper surface of the bonding pad 625, and the second cell strings 621 may include ground selection lines, word lines, and string selection lines. Ground selection lines of the second cell strings 621 may be electrically connected to the second common source line 623. In addition, a bit line 630 may be disposed between the first cell strings 611 and the second cell strings 621. The bit line 630 may be implemented as a metal layer. The second cell area CELL2 may include a second contact plug 651 electrically connected to the bit line pad 653 made of metal and an upper bonding metal 641. The second cell region CELL2 and the peripheral circuit region PERI may be electrically connected through the upper bonding metals 631 and 641 and the lower bonding metals 632 and 642. Further, the upper bonding metals 631 and 641 in the second cell region CELL2 may be referred as first metal pads and the lower bonding metals 632 and 642 in the peripheral circuit region PERI may be referred as second metal pads.

The peripheral circuit area PERI may include a second substrate 603 and a plurality of circuit elements formed on the second substrate 603.

According to a present exemplary embodiment of the inventive concept, the memory device 600 may be implemented according to the above-described embodiments with reference to FIGS. 1 to 12. For example, the memory device 600 may perform the erase operation for at least one of the first cell strings 611 of the first cell area CELL1 and/or at least one of the second cell strings 621 of the second cell area CELL2 according to the above-described embodiments with reference to FIGS. 1 to 12.

For example, the memory device 600 may include the substrate bias circuits 150 and 250 and/or the substrate monitor circuit 260 in the peripheral circuit region PERI. In addition, although not shown in FIG. 13, the first substrate 601 may include a substrate junction region J_SUB, and the substrate junction region J_SUB may be connected to the substrate bias circuits 150 and 250 through a contact plug. The bonding pad 625 may include a junction region serving as a substrate junction region J_SUB, and the junction region may be connected to the substrate bias circuits 150 and 250 through a contact plug. The operation of the memory device 600 may be performed substantially identical to the above-described embodiments with reference to FIGS. 1 to 12, and a description identical to those given above with reference to FIGS. 1 to 12 will be omitted.

Meanwhile, since a distance between the first cell strings 611 of the first cell region CELL1 and the substrate bias circuits 150 and 250 and a distance between the second cell strings 621 of the second cell region CELL2 and the substrate bias circuits 150 and 250 are different, at least one of among a delay time, a target voltage and an erase voltage of each of the first cell strings 611 and the second cell strings 621. For example, referring to FIG. 13, since the first cell strings 611 are disposed farther from the substrate bias circuits 150 and 250 the second cell strings 621, the time for the target voltage or the erase voltage to reach may be longer, and a voltage loss due to the resistance may be greater. Accordingly, at least one of the delay time, the target voltage, and the erase voltage of the first cell strings 611 may be set to be longer (or bigger) than the delay time, the target voltage, and the erase voltage of the second cell strings 622.

According to a modified embodiment, the memory device 600 may perform the erase operation on at least one of the first cell strings 611 using the first common source line 613, the first contact plug 652 and the second contact plug 651 of the first cell region CELL1 according to the above-described embodiment. Also, the memory device 600 may perform the erase operation on at least one of the second cell strings 621 using the second common source line 623 and the bonding pad 625 of the second cell region CELL2 according to the above-described embodiment.

For example, the target voltage may be applied to the first common source line 613 for a delay time as the first common source line voltage through the first contact plug 652 and the second contact plug 652. In addition, the first common source line voltage is input to the first common source line 613 while the level of the first common source line voltage is gradually increased from the target voltage to the erase voltage. At this time, the ground selection line voltage is applied to the ground selection line of the first cell strings 611, and the ground selection line voltage may have a voltage level lower than the erase voltage by a predetermined voltage.

For example, the target voltage may be applied to the second common source line 623 for a delay time as the second common source line voltage through the bonding pad 625. In addition, the second common source line voltage is input to the second common source line 623 while the level of the second common source line voltage is gradually increased from the target voltage to the erase voltage. At this time, the ground selection line voltage is applied to the ground selection line of the second cell strings 621, and the ground selection line voltage may have a voltage level lower than the erase voltage by a predetermined voltage.

The peripheral circuit region PERI may include the control logic circuit 120 and the voltage generating circuit of FIG. 1, and the voltage generating circuit may generate the common source line voltage and the ground select line voltage according to the control signal of the control logic circuit 120. The ground select line voltage may be applied to the ground select line GSL through a pad that electrically connects the voltage generating circuit and the ground select line GSL.

Meanwhile, since a distance between the first cell strings 611 of the first cell region CELL1 and the voltage generating circuit and a distance between the second cell strings 621 of the second cell region CELL2 and voltage generating circuit are different, at least one of among a delay time, a target voltage and an erase voltage of each of the first cell strings 611 and the second cell strings 621. For example, referring to FIG. 13, since the first cell strings 611 are disposed farther from the voltage generating circuit than the second cell strings 621, the time for the target voltage or the erase voltage to reach may be longer, and a voltage loss due to the resistance may be greater. Accordingly, at least one of the delay time, the target voltage, and the erase voltage of the first cell strings 611 may be set to be longer (or bigger) than the delay time, the target voltage, and the erase voltage of the second cell strings 622.

Figure 14:
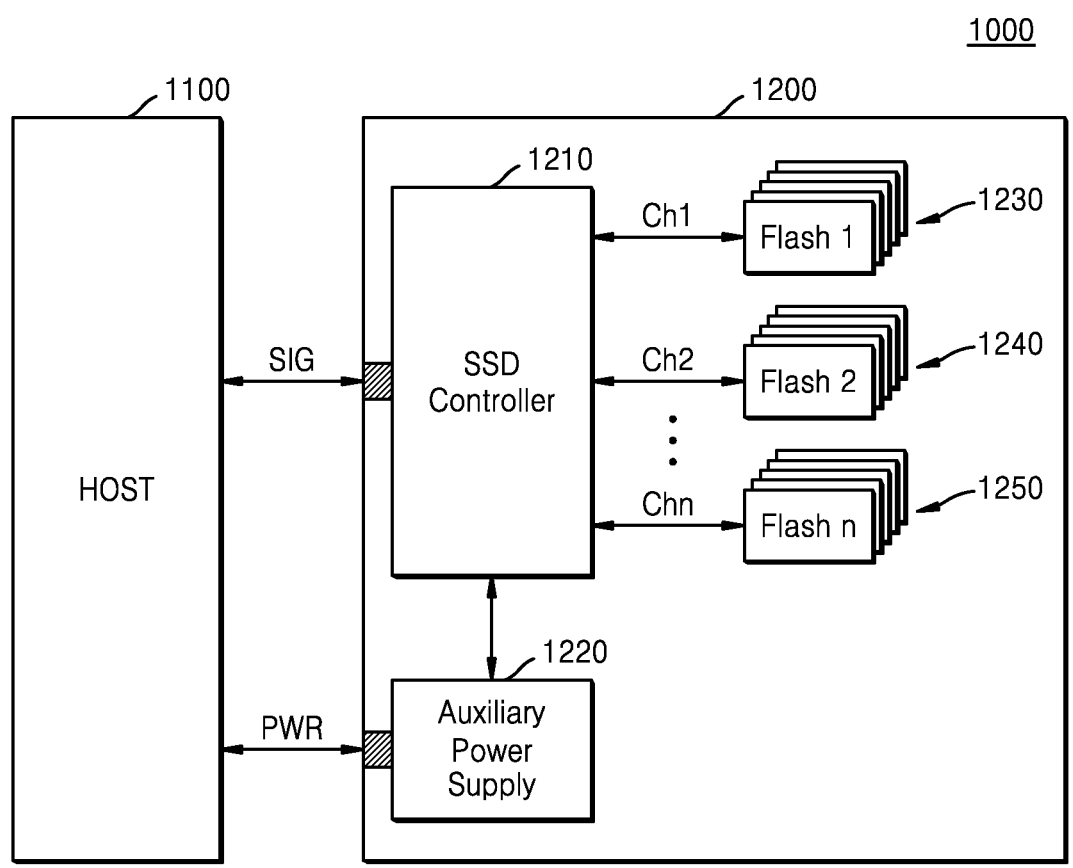
FIG. 14 is a block diagram showing a solid state drive (SSD) system including a memory device according to an exemplary embodiment of the inventive concept.

FIG. 14 is a block diagram showing a solid state drive (SSD) system including a memory device according to an exemplary embodiment of the inventive concept.

Referring to FIG. 14, an SSD system 1000 includes a host 1100 (e.g., a host device) and an SSD 1200. The SSD 1200 may transmit/receive signals SIG to/from the host 1100 through a signal connector and may receive power PWR through a power connector.

The SSD 1200 includes an SSD controller 1210 (e.g., a control circuit), an auxiliary power supply 1220, and a plurality of memory devices 1230, 1240, and 1250. Each of the plurality of memory devices 1230, 1240, and 1250 may be a vertically-stacked NAND flash memory device and may be implemented according to the embodiments described above with reference to FIGS. 1 through 13. Therefore, each of the memory devices 1230, 1240, and 1250 may perform an erase operation with improved reliability and speed.

While the inventive concept has been particularly shown and described with reference to embodiments thereof, it will be understood that various changes in form and details may be made therein without departing from the spirit and scope of the inventive concept.

What is claimed is:

1. A non-volatile memory device comprising:
a memory cell region including a first metal pad;
a peripheral circuit region including a second metal pad and being vertically connected to the memory cell region by the first metal pad and the second metal pad;
a substrate provided in the memory cell region;
a memory cell array provided in the memory cell region and comprising:
a plurality of gate conductive layers stacked on the substrate; and
a plurality of pillars penetrating through the plurality of gate conductive layers and extending in a direction perpendicular to a top surface of the substrate, wherein at least one of the plurality of gate conductive layers is a ground select line;
a control logic circuit provided in the peripheral circuit and being configured to output an erase enable signal for controlling an erase operation on the memory cell array;
a substrate bias circuit provided in the peripheral circuit and being configured to, based on the erase enable signal, output a substrate bias voltage at a first target level to the substrate from a first time to a second time after the first time during a first delay period, after the first delay period, a level of the substrate bias voltage gradually increasing to an erase voltage being higher level than the first target level; and
a row decoder provided in the peripheral circuit and being configured to apply a ground voltage to the ground select line based on control of the control logic circuit during the first delay period.

2. The non-volatile memory device of claim 1, wherein the substrate further comprises a substrate junction region connected to one or more contact plugs and receiving the substrate bias voltage via the one or more contact plugs, and
wherein the memory cell array comprises a plurality of memory blocks including:
a first memory block being located at a first distance from the substrate junction region; and
a second memory block being located at a second distance from the substrate junction region, the second distance being greater than the first distance, and the first delay period being based on the first distance and the second distance.

3. The non-volatile memory device of claim 2, wherein the second memory block is located at the center from among the plurality of memory blocks.

4. The non-volatile memory device of claim 2, wherein, in at least a portion of the first delay period, a level of the substrate bias voltage applied to a region of the substrate overlapping with the second memory block is substantially identical to the first target level.

5. The non-volatile memory device of claim 1, wherein:
the substrate further comprises a first substrate junction region and a second substrate junction region, each of the first and second substrate junction regions being connected to one or more contact plugs and being configured to receive the substrate bias voltage via the one or more contact plugs,
the memory cell array comprises a third block in a first plain located a third distance from the first substrate junction region and a fourth block in a second plain located a fourth distance from the second substrate junction region, and
the substrate bias circuit, based on the erase enable signal corresponding to a multi plane block erase command, is configured to:
output a first substrate bias voltage at a second target level through the first substrate junction region for a second delay period time and, after the second delay period, a level of the first substrate bias voltage gradually increasing to the erase voltage, and
output a second substrate bias voltage at a third target level through the second substrate junction region for a third delay period time and, after the third delay period, a level of the second substrate bias voltage gradually increasing to the erase voltage.

6. The non-volatile memory device of claim 1, wherein the row decoder is configured to float the ground select line after the first delay period.

7. The non-volatile memory device of claim 1, wherein at least one of the control logic circuit and the substrate bias circuit is arranged to overlap with the memory cell array in a vertical direction.

8. The non-volatile memory device of claim 1, further comprising a monitoring circuit provided in the peripheral circuit and being configured to monitor voltages applied to the substrate and output a delay control signal to the substrate bias circuit for controlling the first delay period, and wherein the delay control signal is formed based on a result of the monitoring.

9. A method of erasing a non-volatile memory device comprising a memory cell region including a first metal pad, a peripheral circuit region including a second metal pad and vertically connected to the memory cell region by the first metal pad and the second metal pad, a substrate in the memory cell region and a plurality of memory blocks in the memory cell region including a plurality of cell strings disposed on the substrate and a plurality of cell transistors stacked in a direction perpendicular to the substrate, each cell string including one or more ground select transistors, the method comprising:

applying, by a control circuit of the non-volatile memory in the peripheral circuit, a ground voltage to a ground select line connected to the ground select transistor and a substrate bias voltage at a first target level to the substrate from a first time to a second time after the first time during a first delay period; and gradually increasing, by the control circuit, a level of the substrate bias voltage to an erase voltage having a higher level than the first target, after the first delay period.

10. The method of claim 9, wherein, in the applying of the substrate bias voltage at the first target level to the substrate, a voltage at the first target level is input to the substrate as step-pulses.

11. The method of claim 9, wherein the gradually increasing of the level of the substrate bias voltage further comprises floating the ground select line.

12. The method of claim 9, wherein each of the plurality of cell transistors further comprises one or more dummy transistors arranged between the plurality of cell transistors and the ground select transistor, and wherein the gradually increasing of the level of the substrate bias voltage to the erase voltage further comprises:

gradually increasing the level of the substrate bias voltage to a second target level having a higher level than the first target level and a lower level than the erase voltage, during a second time period; and floating dummy word lines connected to the one or more dummy transistors.

13. The method of claim 12, wherein each of the plurality of cell strings comprises a plurality of dummy transistors, and, in the floating of the dummy word lines, dummy word lines connected to, from among the plurality of dummy transistors, at least one of a dummy transistor adjacent to the ground select transistor and a dummy transistor adjacent to the plurality of cell transistors are floated.

14. The method of claim 13, wherein the floating of the dummy word lines further comprises applying a word line erase voltage to dummy word lines connected to dummy transistors other than the dummy transistor adjacent to the ground select transistor and the dummy transistor adjacent to the plurality of cell transistors.

15. The method of claim 9, wherein the substrate further comprises a substrate junction region, which is connected to one or more contact plugs and receives the erase voltage via the one or more contact plugs, further comprising setting the first delay period based on a distance between the substrate junction region and a memory block disposed at a center of the plurality of memory blocks.

16. The method of claim 9, further comprising:

monitoring voltages applied to respective regions of the substrate overlapping with at least two memory blocks from among the plurality of memory blocks; and setting the first delay period based on a result of the monitoring.

17. A non-volatile memory device comprising:

a first memory cell region including a first metal pad;

a peripheral circuit region including a second metal pad and being vertically connected to the first memory cell region by the first metal pad and the second metal pad;

a substrate in the first memory cell region;

a first memory cell array in the first memory cell region comprising a first common source line, and first cell strings, wherein the first cell strings comprise at least one first ground select line;

a control logic circuit in the peripheral circuit configured to output an erase enable signal for controlling an erase operation with respect to the first memory cell array; and a voltage generating circuit provided in the peripheral circuit and being configured to, based on the erase enable signal for the first memory cell array, output a first common source line voltage at a first target level to the first common source line from a first time to a second time after the first time during a first delay period, after the first delay period, a level of the first common source line voltage gradually increasing to an first erase voltage having a higher level than the first target level, and output a first ground select line voltage at a level lower than the first erase voltage by a predetermined voltage to the first ground select line.

18. The non-volatile memory device of claim 17, further comprising:

a second memory cell region electrically connected to the first memory cell region through a metal layer, the peripheral circuit region being vertically connected to the second memory cell region by the first metal pad and the second metal pad; and a second memory cell array provided in the second memory cell region and comprising a second common source line and second cell strings, wherein the second cell strings comprise at least one second ground select line, wherein:

the control logic circuit is configured to output the erase enable signal for controlling the erase operation on at least one of the first memory cell array and the second memory cell array, and the voltage generating circuit, based on the erase enable signal for the second memory cell array, is configured to output a second common source line voltage at a second target level to the second common source line from a third time to a fourth time after the third time during a second delay period, after the second delay period, a level of the second common source line voltage gradually increasing to an second erase voltage having a higher level than the second target level, and output a second ground select line voltage at a level lower than the second erase voltage by a predetermined voltage to the second ground select line.

19. The non-volatile memory device of claim 18, further comprising one or more contact plugs electrically connecting the second memory cell array and the voltage generating circuit, wherein the voltage generating circuit is configured to output the first common source line voltage to the first memory cell array through the first metal pad and the second metal pad, and output the second common source line voltage to the second memory cell array through the one or more contact plugs.

20. The non-volatile memory device of claim 18, wherein a first distance between the first memory cell array and the voltage generating circuit is longer than a second distance between the second memory cell array and the voltage generating circuit, and wherein the second delay period is longer than the first delay period.

\* \* \* \* \*